(12) United States Patent
Wang et al.

(10) Patent No.: US 8,054,110 B2
(45) Date of Patent: Nov. 8, 2011

(54) DRIVER CIRCUIT FOR GALLIUM NITRIDE (GAN) HETEROJUNCTION FIELD EFFECT TRANSISTORS (HFETS)

(75) Inventors: Bo Wang, West Columbia, SC (US); Antonello Monti, Irmo, SC (US); Jason Bakos, Chapin, SC (US); Marco Riva, Canonica d'Adda (IT)

(73) Assignee: University of South Carolina, Columbia, SC (US)

( * ) Notice: Subject to any disclaimer, the term of this patent is extended or adjusted under 35 U.S.C. 154(b) by 39 days.

(21) Appl. No.: 12/690,495

(22) Filed: Jan. 20, 2010

(65) Prior Publication Data
US 2011/0025397 A1 Feb. 3, 2011

Related U.S. Application Data

(60) Provisional application No. 61/205,316, filed on Jan. 20, 2009, provisional application No. 61/211,612, filed on Apr. 1, 2009.

(51) Int. Cl.
*H03B 1/00* (2006.01)
*H03K 3/00* (2006.01)
(52) U.S. Cl. ........ 327/109; 327/108; 327/110; 327/111; 327/112; 327/333
(58) Field of Classification Search .................. 327/109, 327/110, 333
See application file for complete search history.

(56) References Cited

U.S. PATENT DOCUMENTS 4,724,342 A 2/1988 Sato et al.
7,843,237 B2 * 11/2010 Strzalkowski et al. ....... 327/108

OTHER PUBLICATIONS

Chen, F.C. Lee, L. Amoroso, Ho-Pu Wu, "A Resonant MOSFET Gate Driver With Efficient Energy Recovery", IEEE Transaction on Power Electronics, vol. 19, No. 2, Mar. 2004 pp. 470-477.
H. Ballan, High-voltage Devices and Circuits in standard CMOS Technologies, PhD Thesis EPFL,1997.
Richard. M. Forsyth, "Technology and Design of integrated circuits for up to 50Vapplications", austria microsystems AG, Schloss Premstaetten, Unterpremstaetten, Austria, 2003 IEEE, pp. 7-13.
B.Wang, N. Tipirneni, M.Riva, A.Monti, G.Simin, E,Santi, "An efficient, High-frequency Drive Circuit for GaN power HFETs", IEEE Transactions on Industry Applications, vol. 45, No. 2, Mar./Apr. 2009, pp. 843-853.
B. Wang, M. Riva, J. Bakos, A. Monti, "Integrated Circuit Implementation for a GaN HFETs Driver Circuit", Applied Power Electronic Conference (APEC), 2008, pp. 1-6.

* cited by examiner

*Primary Examiner* — Lincoln Donovan
*Assistant Examiner* — John Poos
(74) *Attorney, Agent, or Firm* — Dority & Manning, P.A.

(57) ABSTRACT

A driver circuit and integrated circuit implementation of a driver circuit for driving a GaN HFET device is disclosed. The driver circuit includes a resonant drive circuit having an LC circuit with an inductance and a capacitance. The capacitance of the LC circuit includes the gate-source capacitance of the GaN HFET device. The driver circuit further includes a level shifter circuit configured to receive a first signal and to amplify the first signal to a second signal suitable for driving a GaN HFET device. The resonant drive circuit is controlled based at least in part on the second signal such that the resonant drive circuit provides a first voltage to the GaN HFET device to control the GaN HFET device to operate in a conducting state and to provide a second voltage to the GaN HFET device to control the GaN HFET device to operate in a non-conducting state.

16 Claims, 14 Drawing Sheets

US 8,054,110 B2

DRIVER CIRCUIT FOR GALLIUM NITRIDE (GAN) HETEROJUNCTION FIELD EFFECT TRANSISTORS (HFETS)

PRIORITY CLAIM

The present application claims the benefit of priority of U.S. Provisional Patent Application Ser. No. 61/205,316 filed Jan. 20, 2009, and claims the benefit of priority of U.S. Provisional Patent Application Ser. No. 61/211,612 filed Apr. 1, 2009, both of which are incorporated by reference herein in their entireties for all purposes.

STATEMENT OF GOVERNMENT INTEREST

The present invention was developed with funding from the Office of Naval Research under award N00014-07-1-0603; N00014-05-0734; and N00014-03-1-0940. Therefore, the government retains certain rights in this invention.

BACKGROUND

The present disclosure relates generally to gallium nitride (GaN) heterojunction field effect transistors (HFETs) and, more particularly, to a driver circuit and integrated circuit implementation of a driver circuit for GaN HFETs.

Research on wide-band III-Nitride semiconductor materials, such as GaN, has been rapidly developing in the past few years. These materials have unique properties, including high electron mobility, high saturation velocity, high sheet-carrier concentration at heterojunction interfaces, high breakdown voltages, low thermal impedance (when grown over SiC or bulk AlN substrates), chemical inertness, and radiation hardness.

Compared with Si FETs, GaN HFETs have lower specific on-resistance due to the high-density, two-dimensional electron gas, and high electron mobility. For instance, the on-resistance of GaN HFETs is almost three orders lower than that of Si MOSFETs. In addition, GaN HFETs can work at relatively high temperature ranges which Si MOSFETs cannot reach and have higher breakdown fields than Si MOSFETs due to the large bandgap energy of GaN material. III-Nitride transistors have been shown to operate at up to 300° C. with no noticeable parameter degradation. III-Nitride transistors also have high breakdown voltages of up to, for instance, 1600V. Furthermore, the switching speeds of GaN HFETs are expected to be higher than those of Si MOSFETs due to low gate-source capacitance.

Both the relatively low gate-source capacitance and relatively low on-resistance of GaN HFETs provide for good switching characteristics. For instance, when applied to power electronics, the GaN HFETs allow for high power switching with sub-microsecond and nanosecond switching times. These properties make III-Nitride technology a promising approach for high-power, high-temperature, high-speed, and high-efficiency applications. Using insulated gate III-Nitride HFETs further increases achievable power levels and further improves high temperature stability. Because of the above characteristics, GaN HFETs would be extremely useful in industrial power electronic applications and would improve efficiency and regulation in, for instance, AC-DC and DC-DC power converters, DC-AC inverters, and other power electronic devices.

Currently, however, driver circuits for GaN HFET switches are not commercially available. The lack of available high-frequency driver circuits is one factor preventing the application of GaN HFETs in power electronic devices. Modified driver integrated circuits for power Si MOSFETs can be used to drive GaN HFET switches. Unfortunately, however, most modified driver circuits for power Si MOSFETs work at low frequencies, such as below 1 MHz. A few driver circuits are known to work at about 5 MHz, but the output impedance of these driver circuits is not compatible with GaN HFET devices and can lead to unnecessary power loss.

Conventional driver circuits typically include a pair of complementary devices, such as a pair of emitter followers in an AB class amplifier or PMOS and NMOS transistors in a totem pole configuration. These devices supply the charge needed to charge the gate-source capacitance of the power transistor to allow the transistor to turn on and off (i.e. switch between a conducting state and a non-conducting state). These approaches are well-suited for low frequency applications. However, when the frequency increases, neither the losses due to switching the driver circuit MOSFETs or the power transistor are acceptable.

Driver circuits capable of operating at high frequencies exist. Among these approaches, one of the most efficient is the resonant gate drive circuit. In a resonant gate drive circuit, switching loss reduction, critical in high frequency applications, is obtained by resonant transitions in an LC circuit that involves the gate-source capacitance of the power transistor.

FIG. 1 illustrates an exemplary resonant drive circuit 100 with efficient energy recovery capabilities and FIG. 2 depicts its relevant wave forms. The principle of operation of the resonant drive circuit 100 is that energy stored in the gate-source capacitance $C_{iss}$ for power transistor 120 is recycled and stored back in the gate-source capacitance $C_{iss}$, but with the opposite voltage polarity. Thus, energy is always stored in the gate-source capacitance $C_{iss}$, but the effective gate-source capacitor voltage is alternated between a positive voltage state and a negative voltage state. In this manner, a quasi square wave voltage can be imposed on gate-source capacitance $C_{iss}$ in a low-loss manner. The process is achieved when the inductor $L_R$ and capacitance $C_{iss}$ are resonating together, with resonance being stopped when the gate-source capacitance $C_{iss}$ is at a minimum or at a maximum With reference to FIGS. 1 and 2, the operation of the exemplary resonant drive circuit 100 will now be discussed beginning at the negative storage position when the gate-source voltage Vgs_M1 of power transistor 120 is approximately zero and when both PMOS transistor 102 and NMOS transistor 104 are turned off (i.e. are in a non-conducting state). At time t1, when PMOS transistor 102 is turned on, the inductor current $i_{LR}$ begins to flow and charges the gate-source capacitor $C_{iss}$ of the power transistor 120. When the voltage across the gate-source capacitor $C_{iss}$ reaches a value slightly higher than VDD at t2, the diode 110 conducts and clamps the gate-source voltage Vgs_M1 at VDD and the inductor current $i_{LR}$ continues to flow freewheeling along diode 110. At time t3, PMOS transistor 102 turns off causing the inductor current $i_{LR}$ to decrease. This causes the diode 108 to conduct and the inductor current $i_{LR}$ to flow from GND to VDD by way of diode 108, inductor $L_R$, and diode 110, thereby returning energy to the voltage source VDD. Between t3 and t4, the inductor current $i_{LR}$ decreases from $I_{PEAK}$ to zero and the gate source voltage Vgs_M1 remains at VDD.

At time t5, the NMOS transistor 104 turns on and the inductor current $i_{LR}$ begins to flow in the opposite direction, discharging the gate-source capacitance $C_{iss}$ of the power transistor 120 until the voltage across gate-source capacitance $C_{iss}$ is slightly less than zero at t6. The diode 112 then conducts and clamps the gate-source voltage Vgs_M1 of power transistor 120 at zero as the inductor current $i_{LR}$ continues to flow freewheeling along diode 112. At time t7, when NMOS transistor 104 turns off, the inductor current increases, causing the diode 106 to conduct. The inductor current $i_{LR}$ then flows from GND to VDD by way of diode 112, inductor $L_R$ and diode 106, returning energy to the voltage source VDD. Between t7 and t8, the inductor current $i_{LR}$ increases from $-I_{PEAK}$ to zero and the gate-source voltage Vgs_M1 of the power transistor 120 remains at GND.

By using the LC resonant circuit topology discussed above and the two clamp diodes 110 and 112, the power losses of the driving circuit 100 can be reduced. Indeed, the smaller the gate resistance of power transistor 120, the smaller the power loss of the driver circuit 100. In addition, energy used for commutation can be recovered.

While the high efficiency drive circuit 100 of FIG. 1 is a suitable driver circuit for high-frequency applications and has the property of voltage clamping required for driving GaN HFETs, the resonant drive circuit 100 of FIG. 1 is not directly applicable to GaN HFET devices. For instance, GaN HFETs are zero voltage turn-on devices. In particular, GaN HFETs require a zero voltage to turn on (i.e. to be in a conducting state) and a negative voltage to turn off (i.e. to be in a non-conducting state). Therefore, a driver circuit for GaN HFETs must be able to work under a negative voltage supply VSSH and GND.

Moreover, GaN HFETs operating above 10 MHz demand a high-speed drive circuit with a 50 mA or higher output current. Most of the commercially available PMOS and NMOS transistors have much higher output current rates which are not compatible with GaN HFET devices and lead to unnecessary power loss. In addition, most commercially available power MOSFETs have long rise and fall times. For example, high frequency power MOSFETs have rise and fall times around 10 ns. Using a discrete power PMOS and NMOS as the totem pole pair for the drive circuit will add extra delay to the driver circuit and consequently limit the operation frequency of the drive circuit.

Thus, there is a need for a driver circuit and integrated circuit implementation of a driver circuit that is compatible with GaN HFETs that overcomes the above-mentioned disadvantages.

SUMMARY

Aspects and advantages of the invention will be set forth in part in the following description, or may be obvious from the description, or may be learned through practice of the invention.

One exemplary embodiment of the present disclosure is directed to a driver circuit for driving a III-Nitride HFET device, such as a GaN HFET device. The driver circuit includes a resonant drive circuit having an LC circuit with an inductance and a capacitance. The capacitance of the LC circuit includes the gate-source capacitance of the III-Nitride HFET device. The driver circuit further includes a level shifter circuit configured to receive a first signal and to amplify the first signal to a second signal. The polarity of the second signal is different from the polarity of the first signal and the drive capability of the second signal can be increased. The resonant drive circuit is controlled based at least in part on the second signal such that the resonant drive circuit provides a first voltage to the III-Nitride HFET device to control the III-Nitride HFET device to operate in a conducting state and to provide a second voltage to the III-Nitride HFET device to control the III-Nitride HFET device to operate in a non-conducting state.

Variations and modifications can be made to this exemplary embodiment of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
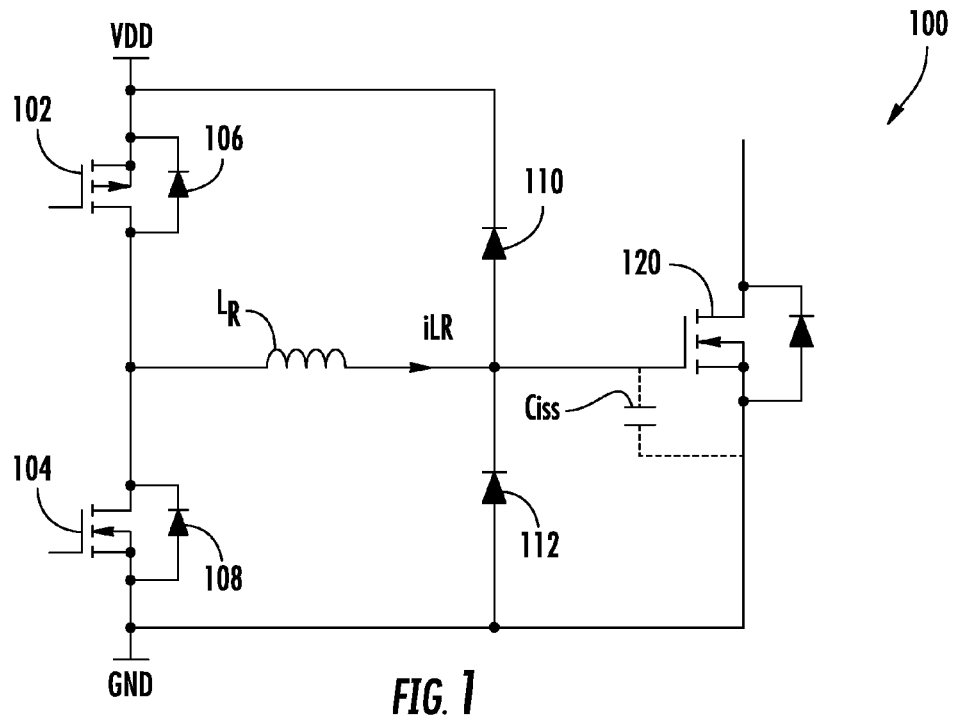
FIG. 1 depicts a circuit diagram of an exemplary known resonant driver circuit for driving power transistors.
Figure 2:
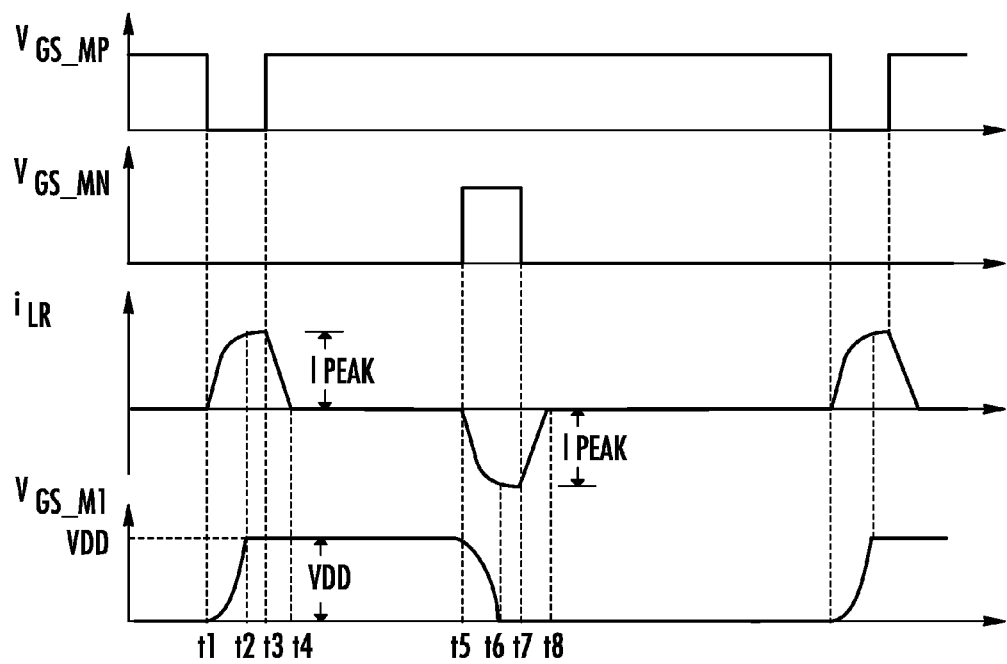
FIG. 2 depicts a graphical depiction of relevant waveforms for the known resonant driver circuit depicted in FIG. 1.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to a driver circuit and integrated circuit implementation of a driver circuit that is suitable for driving GaN HFETs. The driver circuit uses a topology of a resonant drive circuit with effective energy recovery to provide low gate-driver loss, fast switching speed, voltage clamping, small cross-conduction power loss, and high tolerance of time variation of the control signals. The resonant drive circuit topology can be constituted by a high voltage (HV) NMOS and a HV PMOS connected in a totem pole configuration, clamping diodes, inductor, and the gate-source capacitance of a GaN HFET. The inductor can be the parasitic inductance of a conductor used in the driver circuit making the driver circuit free of magnetic components.

GaN HFET devices are zero voltage switch-on devices and need to be driven by a zero voltage to be turned on (i.e. driven to a conductive state) and a negative voltage to be turned off (i.e. be driven to a non-conductive state). For example, in particular implementations, a GaN HFET device needs a 0V signal to be driven to a conductive state and a −7V signal to be driven to a non-conductive state. As used herein, a transistor is considered to be in a conductive state when the transistor is controlled so that current flows between two terminals of the transistor, such as the drain terminal and the source terminal of the transistor. A transistor is considered to be in a non-conductive state when the transistor is controlled so that current does not flow between two terminals of the transistor, such as the drain terminal and the source terminal of the transistor.

To achieve the necessary driver signals for the GaN HFET device, driver circuits according to embodiments of the present disclosure include level shifter means for changing the polarity, voltage level, and current level of typical low power digital signals. The present disclosure provides numerous examples of level shifter circuitry that can act as level shifter means for changing the polarity, voltage level, and current level of the low power digital signals to the requisite driver signals required for a GaN HFET device. The term level shifter means is intended to encompass such disclosed level shifter circuitry as well as equivalents and variations thereof.

The driver circuit according to embodiments of the present disclosure provides numerous advantages. For instance, the use of a smart resonant topology, with effective energy-recovery, reduces the power loss of the circuit. The low-impedance path of the resonant circuit minimizes the conduction losses. The use of small pulse-width signals avoids the cross-conduction of the totem pole arrangement of the PMOS and NMOS transistors which provides further reduction of power loss in the circuit. The resonant inductor limits the switching power loss by slowing down the increase of the drain circuit of the GaN HFET device, which decreases the overlap between the drain current and the drain source voltage of the GaN HFET device. Moreover, the voltage clamped commutation makes the circuit tolerant to the timing variation of the control signals.

Figure 3:
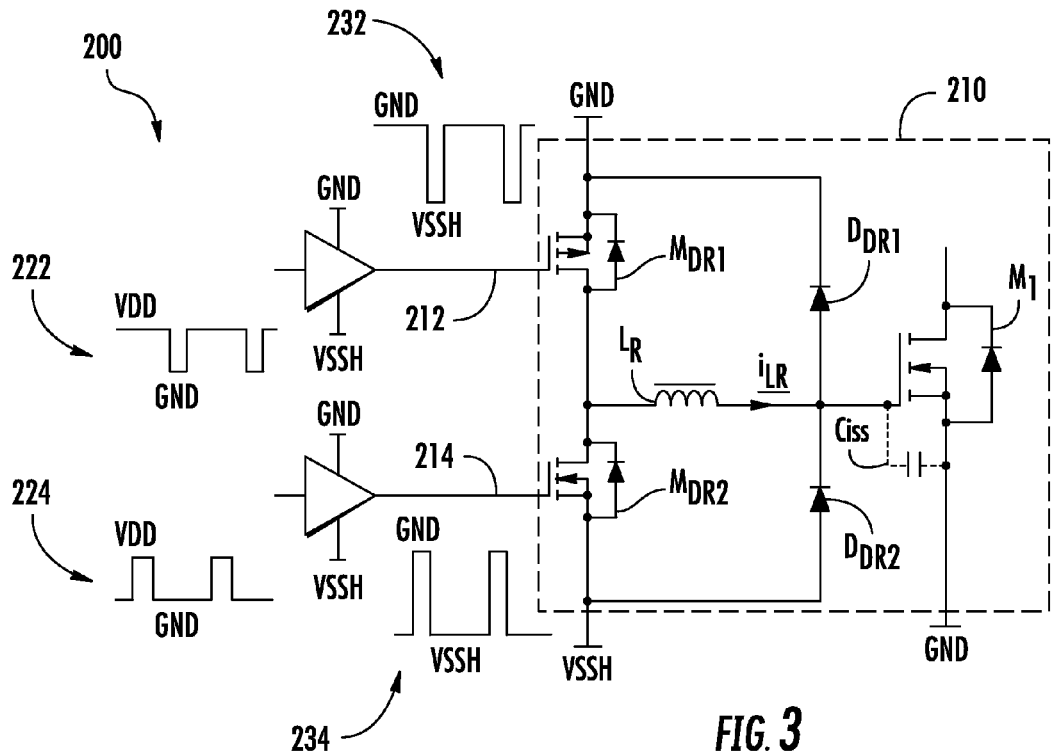
FIG. 3 depicts a driver circuit according to an exemplary embodiment of the present disclosure.

Referring now to FIG. 3, a first exemplary embodiment of a driver circuit 200 according to the present disclosure is illustrated. Driver circuit 200 includes a resonant drive circuit 210 and level shifter circuits 212 and 214. Resonant drive circuit 210 includes a totem pole arrangement of a PMOS transistor $M_{DR1}$ and NMOS transistor $M_{DR2}$ coupled between a reference signal line GND and negative voltage source VSSH. An LC circuit having inductance $L_R$ and capacitance $C_{iss}$ is coupled to a junction between PMOS transistor $M_{DR1}$ and $M_{DR2}$. The inductance $L_R$ can be the parasitic inductance of a conductor used in the LC circuit and capacitance $C_{iss}$ can be the gate-source capacitance of the GaN HFET device $M_1$. The resonant drive circuit 210 further includes a clamping diode $D_{DR1}$ coupled to the LC circuit and PMOS transistor $M_{DR1}$ and a clamping diode $D_{DR2}$ coupled to the LC circuit and the NMOS transistor $M_{DR2}$.

The resonant drive circuit 210 is controlled based on signals received from level shifter circuits 212 and 214. In particular, level shifter circuit 212 provides a signal to PMOS transistor $M_{DR1}$ to control PMOS transistor $M_{DR1}$ to either operate in a conducting state or a non-conducting state (i.e. turn on or turn off). Similarly, level shifter circuit 214 provides a signal to NMOS transistor $M_{DR2}$ to control NMOS transistor $M_{DR2}$ to operate in a conducting state or a non-conducting state (i.e. turn on or turn off).

When the PMOS transistor $M_{DR1}$ is in a conducting state and the NMOS transistor $M_{DR2}$ is in a non-conducting state, the resonant drive circuit 210 provides a first voltage, such as 0V, to the GaN HFET device, controlling the GaN HFET to operate in a conducting state. When the PMOS transistor $M_{DR1}$ is in a non-conducting state and the NMOS transistor $M_{DR2}$ is in a conducting state, the resonant drive circuit 210 provides a second voltage, such as −7V, to the GaN HFET device, controlling the GaN HFET to operate in a non-conducting state.

The level shifter circuits 212 and 214 are configured to change the polarity and to amplify the voltage and power level of input signals to provide signals suitable for driving the GaN HFET device $M_1$. For instance, as shown in FIG. 3, level shifter circuits 212 and 214 receive signals 222 and 224. Signals 222 and 224 are low voltage digital signals that can be provided from an FPGA or digital signal processor. The low voltage digital signals can alternate, for example, between a reference line voltage GND and VDD. In particular embodiments, GND can be about 0V and VDD can be about 3.3 V.

The level shifter circuits 212 and 214 convert signals 222 and 224 into signals 232 and 234 respectively. Signals 232 and 234 alternate between GND and VSSH. In particular embodiments, GND can be about 0V and VSSH can be about −7V. In this manner, level shifter circuits 212 and 214 convert low voltage digital signals into signals suitable for driving GaN HFET device $M_1$. In a particular embodiment, as illustrated in FIG. 3, level shifter circuits 212 and 214 can be operational amplifiers used to change the signals 222 and 224 to signals 232 and 234 with changed polarity and improved drive capability.

Figure 4:
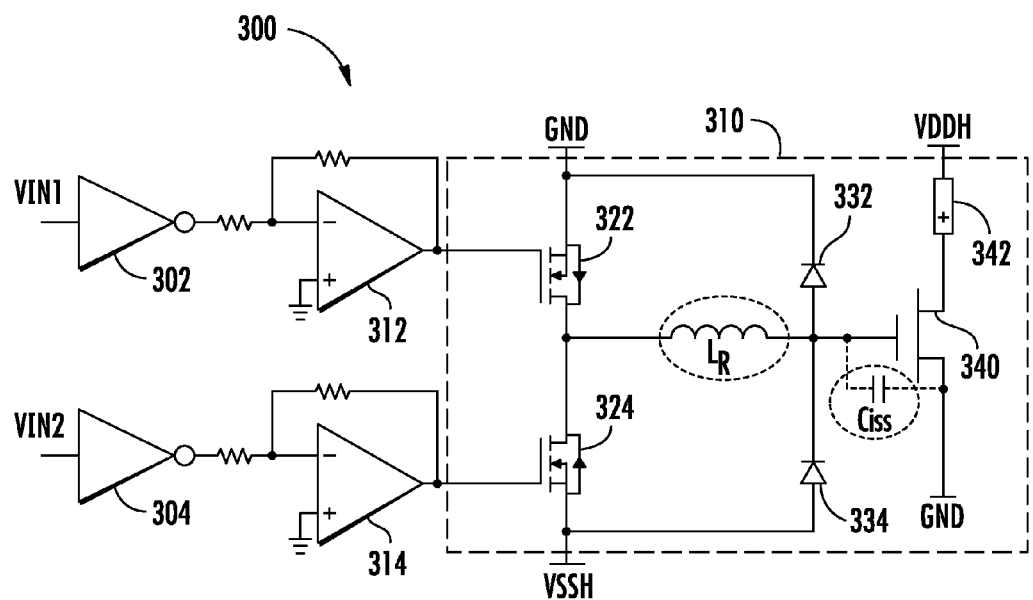
FIG. 4 depicts a driver circuit according to an exemplary embodiment of the present disclosure.

FIG. 4 depicts an exemplary embodiment of a driver circuit 300 implemented using operational amplifiers 312, 314 as level shifting circuits. Input control signals VIN1 and VIN2 are provided through inverter circuits 302 and 304 to the negative input of operational amplifiers 312, 314 respectively. Operational amplifier 312 is coupled to PMOS transistor 322. Operational amplifier 314 is coupled to NMOS transistor 324. To reduce power loss, low on-resistance transistors, such as ZXMD63P02X and ZXMD63N02X, are used for the totem pole arrangement of PMOS transistor 322 and NMOS transistor 324 of resonant drive circuit 310. Schottky diodes, such as 10bq015, were used for diode 332 and diode 334 because they have low forward voltages and small reverse-recovery charges. $L_R$ is the parasitic inductance of the interconnect-wire and can be changed by adjusting the length of the wire. $C_{iss}$ is the gate-source capacitance of the GaN HFET device 340. The load 342 is 1K ohms.

The GaN HFET device 340 can be similar to the GaN HFET device produced in a microelectronic laboratory at the University of South Carolina. In the experimental evaluation, a 100 μm wide AlGaN/GaN HFET device built on sapphire was used in the driver circuit, which has a gate length of 2 μm, gate-to-drain distance of 10 μm and gate-to-source distance of 2 μm. The GaN HFET device has a measured current density of 0.8 A/1 nm, breakdown voltage above 300V and dynamic on-resistance around 5 mΩ·cm2. The GaN HFET device is passivated with silicon nitride and has a field plate with an overhang length of 2 μm for the suppression of current collapse.

Figure 5:
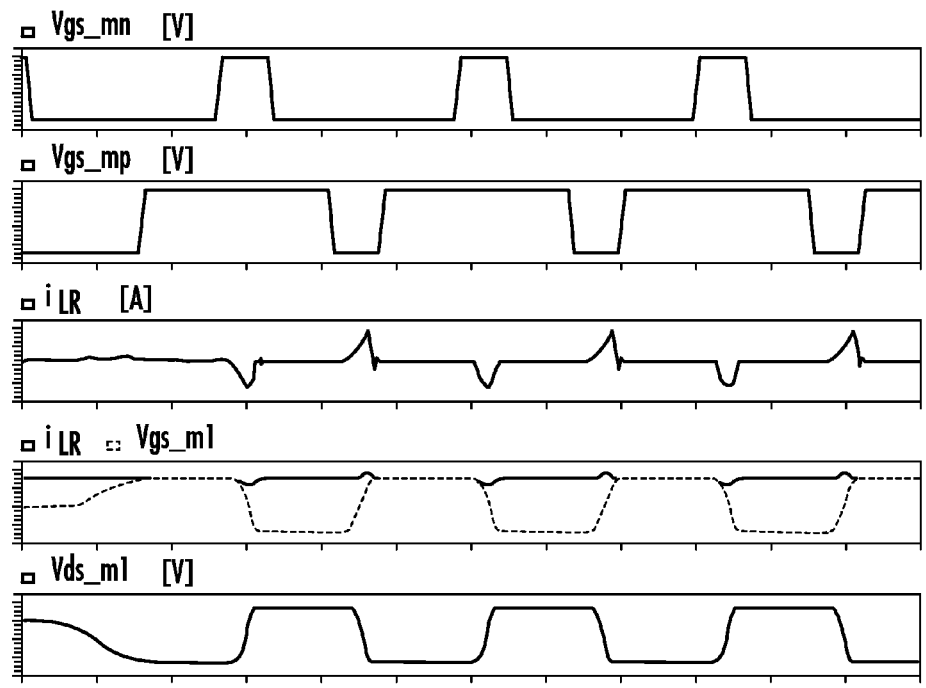
FIG. 5 depicts simulation waveforms for a portion of a driver circuit according to an exemplary embodiment of the present disclosure.
Figure 6:
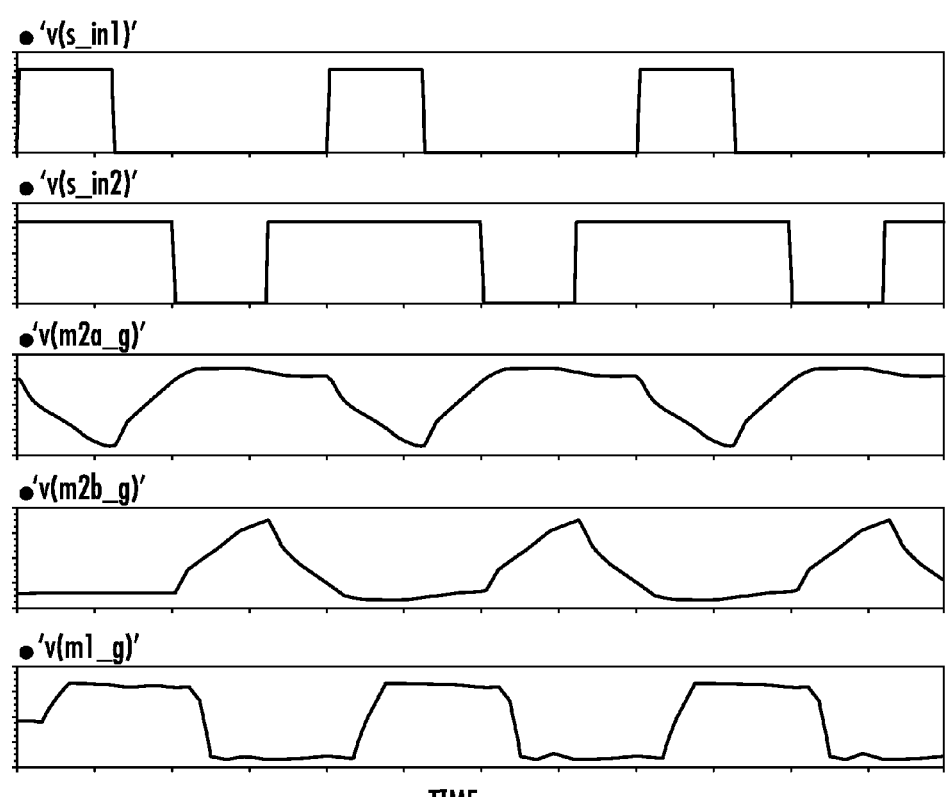
FIG. 6 depicts simulation waveforms for a driver circuit according to an exemplary embodiment of the present disclosure.

FIG. 5 depicts Aimspice simulation results for the resonant drive circuit 310 of FIG. 4 for a 25 MHz switching frequency with a pulse width of 7.5 ns for the input signals. FIG. 6 depicts aimspice simulation results for the entire driver circuit 300 of FIG. 4 for a 5 MHz switching frequency with a pulse width of 65 ns for the input signals. As depicted in FIG. 6, the delay time is 20 ns, the rise time is 8 ns, and the fall time is 8 ns. All these values are much larger than those shown in FIG. 5. The main reason is the mismatch between the operational amplifiers 312, 314 and PMOS transistor 322 and NMOS transistor 324 in the totem pole arrangement. The drive signals from the operational amplifiers 312, 314 are distorted due to the fact that high-speed operational amplifier chips (LT1364) were used to work as the level shifting circuits and because the output currents of these operational amplifiers 312, 314 are approximately 50 mA and are not large enough to drive the power transistors 322, 324 in the totem pole arrangement. These distorted signals lead to longer delay, rise, and fall times for the results shown in FIG. 6, compared to the simulation results shown in FIG. 5. Moreover, conductors used to implement the driver circuit 300 of FIG. 4 can include large parasitic inductances, leading to significant ripples in the gate-source voltage of the GaN HFET device.

The above disadvantages can be overcome through an integrated circuit implementation of a driver circuit according to exemplary embodiments of the present disclosure. An integrated circuit implementation allows for improved matching characteristics between the driver circuit and the GaN HFET device and can also reduce the time delay induced by the driver circuit. An integrated circuit implementation also reduces the size of the driver circuit and makes the application of the driver circuit to GaN HFET devices convenient as well.

Fabrication technology for high-speed digital integrated circuits has traditionally sought to reduce minimum feature size and gate oxide thickness to reduce power supply voltage requirements. However, this trend runs contrary to the demands of power electronic devices, which typically require much higher supply voltages than those used by digital integrated circuits.

Several existing technologies ingrate both, high-voltage (HV) analog and low-voltage (LV) digital circuits onto a single integrated circuit chip to achieve miniaturization, high efficiency, reliability, and low cost. For example, one existing technology for integrating both HV analog and digital circuits onto a single chip is the Smart-Voltage-eXtension (SVX) technology, which implements HV devices in standard CMOS technologies by combining existing layers without modifying process steps. The integrated circuit implementations of the exemplary driver circuits discussed below are implemented using SVX technology. However, those of ordinary skill in the art, using the disclosures provided herein, should understand that other suitable processes for combining HV analog and digital circuits onto a single chip can be used without deviating from the scope of the present disclosure.

Figure 7:
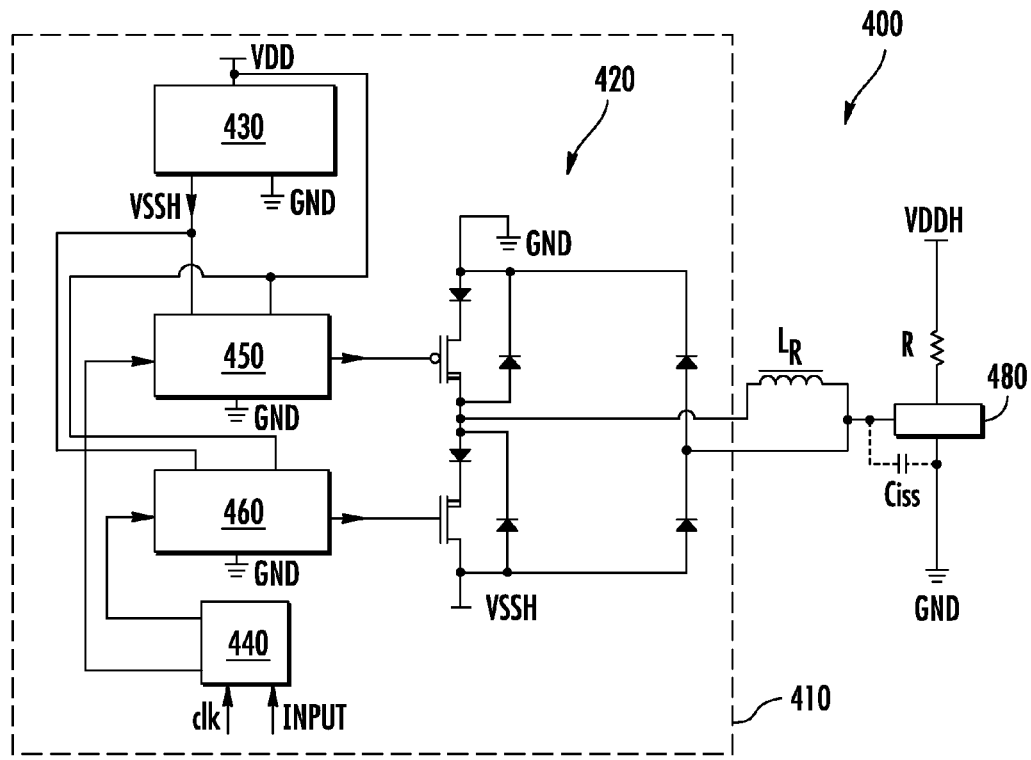
FIG. 7 depicts a driver circuit according to an exemplary embodiment of the present disclosure.

FIG. 7 provides a block diagram of a driver circuit 400 that can be implemented in an integrated circuit according to an exemplary embodiment of the present disclosure. Driver circuit 400 includes resonant drive circuit 420, charge pump circuit 430, level shifter circuits 450 and 460, and digital block 440. The totem pole arrangement and clamping diodes of resonant drive circuit 420, along with charge pump circuit 430, digital block 440, and level shifter circuits 450 and 460, are implemented on an integrated circuit 410 using SVX technology.

Charge pump circuit 430 generates the negative high voltage VSSH required for the resonant drive circuit 420 from the positive low voltage power supply VDD. The digital block 440 converts the low voltage digital signal VDD into two narrow pulse-width control signals. The level shifter circuits 450 and 460 change the polarity and amplify the voltage and power level of the control signals. The amplified signals are used to drive the GaN HFET device 480 by way of resonant drive circuit 420, the detail and operation of which is discussed above. Proper values of inductance $L_R$, obtained by adjusting the length of the PCB wire and of $C_{iss}$, the gate-source capacitance of the GaN HFET device 480, govern the resonant transition.

The level shifter circuits 450 and 460 are used to convert a positive signal with a GND to VDD voltage swing to a negative signal with a voltage swing from GND to VSSH. In a particular embodiment, level shifter circuits 450 and 460 can be two-stage level shifter circuits configured to change the polarity and amplify the control signals provided by digital block 440.

Figure 8:
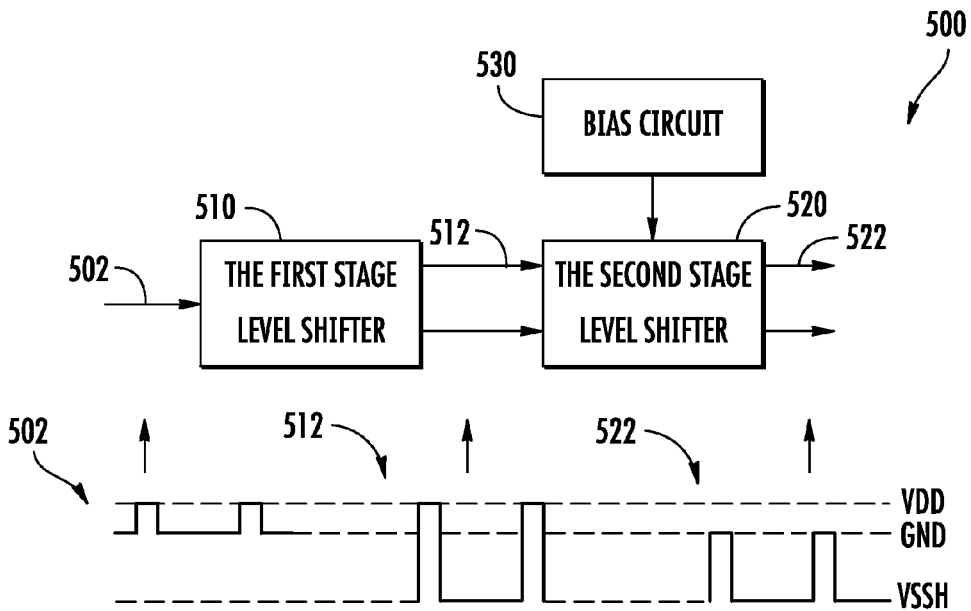
FIG. 8 depicts a block diagram of a two-stage level shifter circuit used in a driver circuit according to an exemplary embodiment of the present disclosure.

A block diagram of an exemplary two-stage level shifter circuit 500 is provided in FIG. 8. As illustrated, the two-stage level shifter circuit 500 includes three main parts, a first stage 510, a second stage 520, and a bias circuit 530. The first stage 510 is configured to receive signal 502 which alternates between GND and VDD and converts signal 502 into signal 512. Signal 512 alternates between VDD and VSSH. Second stage 520 is configured to receive signal 512 and convert signal 512 to signal 522. Signal 522 alternates between GND and VSSH. The bias circuit 530 provides all the bias voltages and currents for the second stage 520.

Figure 9:
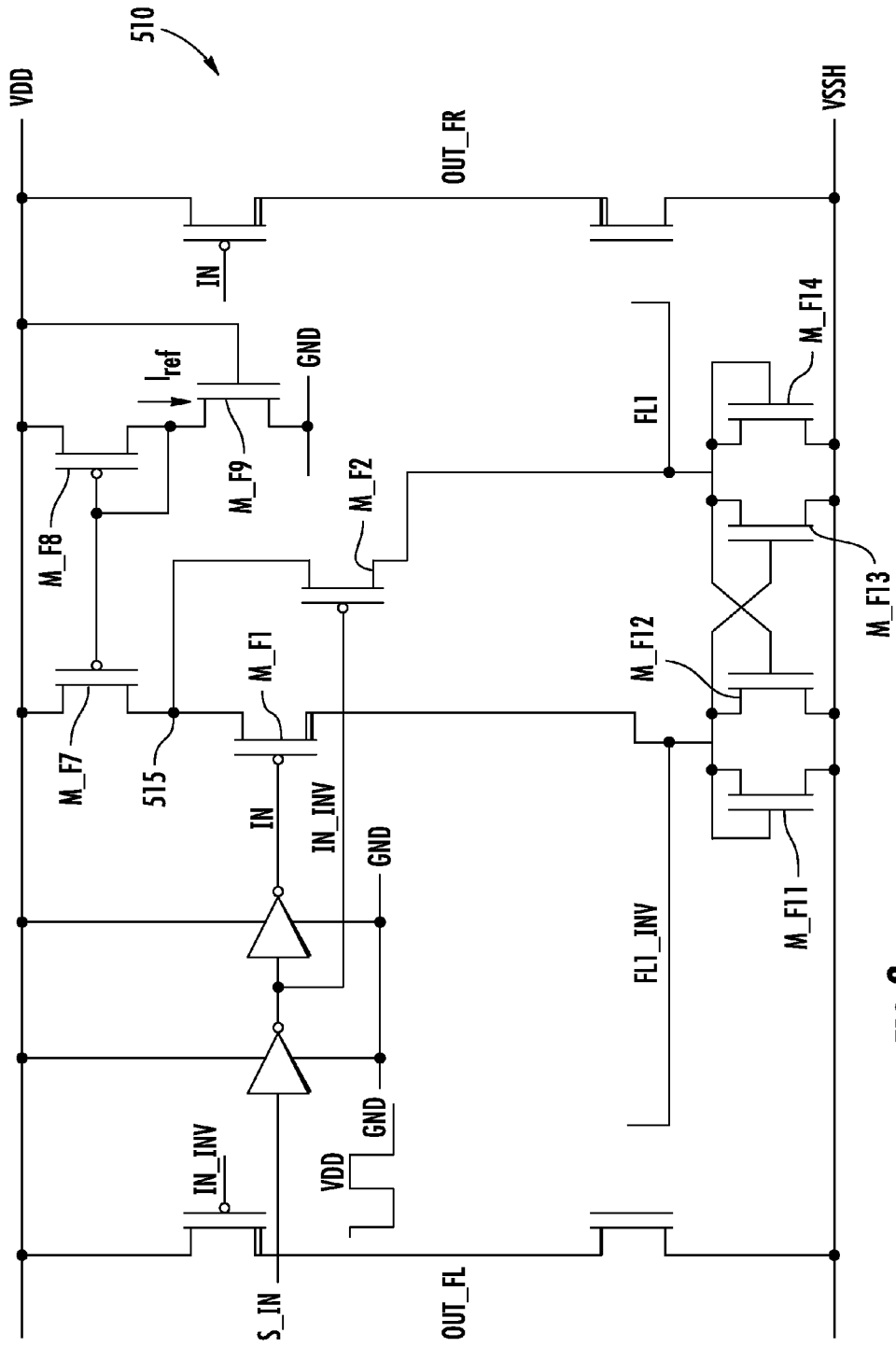
FIG. 9 depicts a circuit diagram of a first stage of a two-stage level shifter circuit used in a driver circuit according to an exemplary embodiment of the present disclosure.

FIG. 9 depicts an exemplary circuit diagram for the first stage 510 of level shifter circuit 500 according to an exemplary embodiment of the present disclosure. Exemplary first stage 510 shown in FIG. 9 includes two coupled voltage mirrors. One voltage mirror includes a HV PMOS M_F1, together with a low-voltage NMOS M_F11 connected in a diode configuration as the load. In parallel to M_F11 is transistor M_F12. The other voltage mirror includes HV PMOS M_F2, together with a low-voltage NMOS M_F14 connected in a diode configuration as the load. In parallel to M_F14, a pull-down transistor M_F13 is used to drive the output voltage to a high-voltage power supply VSSH in the low state.

The driving signal of the gate of M_F13 is complementary to FL1 due to the cross-coupling of two voltage mirrors. Assuming the output voltage is always low enough to make M_F2 work in the saturation region, the NMOS transistor M_F14, connected as a diode, always works in the saturated region.

The current mirror formed by M_F7 and M_F8 is used to generate the current for M_F1 and M_F2. When M_F7 and M_F8 are the same size, a current equal to Iref will switch between M_F11 and M_F14. Using three identical NMOS transistors for M_F11, M_F14, and M_F9, the output voltage level of FL1 depends and can be fixed by the current flowing through M_F11 and M_F14.

The possible deviation of the output voltage VOUT at the output FL1 is given by the tolerance of the low-voltage power supply, according the following:

$$VOUT = VSSH + \left(\sqrt{2\frac{nI_{ref}}{\beta_n}} + |V_{tn}|\right) =$$

$$VSSH + \left(\sqrt{\frac{2n\frac{\beta_n}{2n}(VDD-|V_{tn}|)^2}{\beta_n}} + |V_{tn}|\right) = VSSH + VDD$$

Two high-voltage buffers are added to convert FL1 and FL1_INV to high voltage-swing signals (negative VSSH to positive VDD). Since the input digital signals are about 3.3V, and there is a voltage drop at the current mirror node 515 shown in FIG. 9, low threshold-voltage HV transistors are preferably chosen for the input stage of the first stage low-current level shifter in order to guarantee the input transistor operating without dependence on the process variation and to reduce the transistor size for fast switching.

Figure 10:
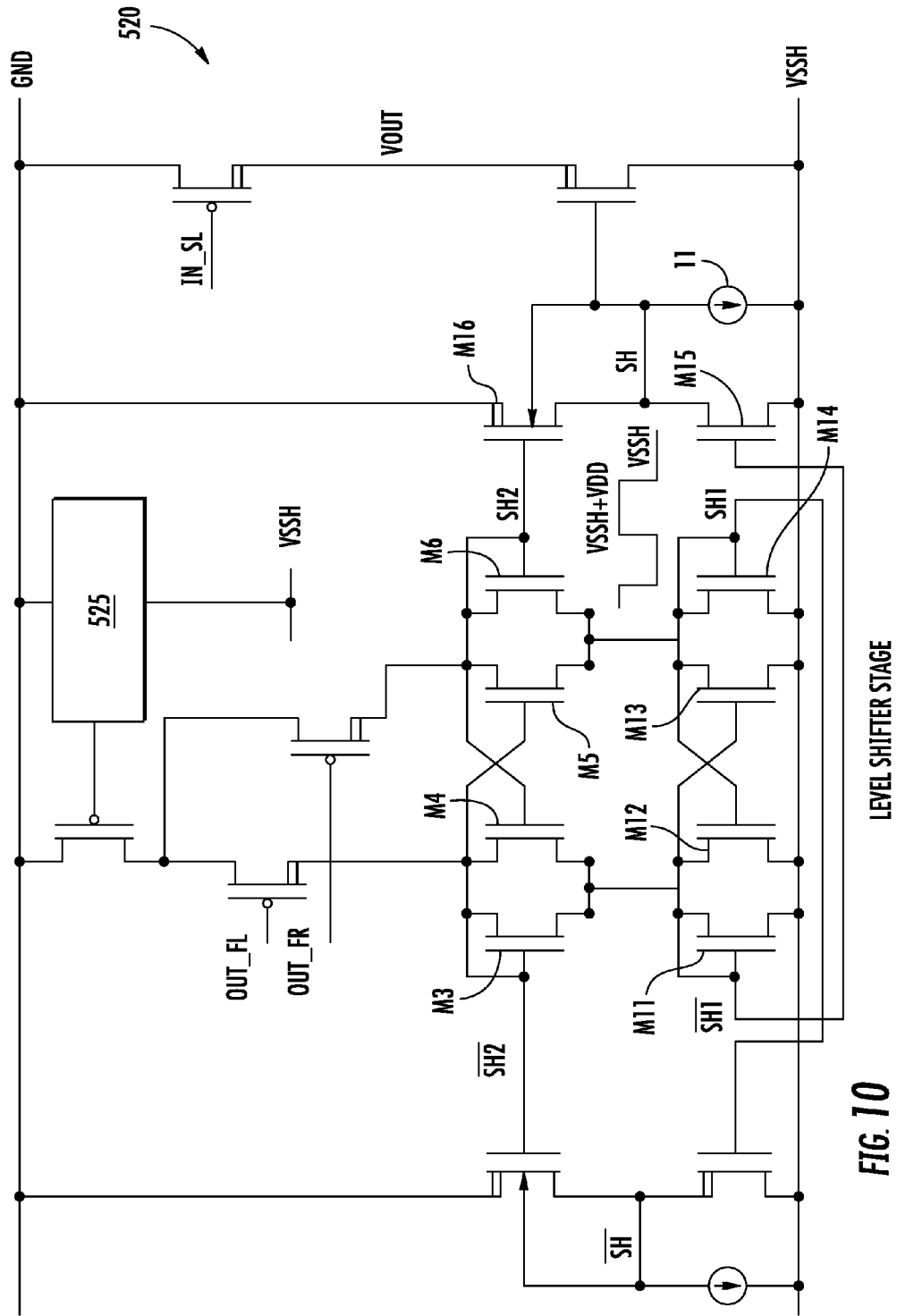
FIG. 10 depicts a circuit diagram of a second stage of a two-stage level shifter circuit used in a driver circuit according to an exemplary embodiment of the present disclosure.

FIG. 10 depicts a circuit diagram for an exemplary second stage 520 of level shifter circuit 500 according to an exemplary embodiment of the present disclosure. The second stage of the level shifter is a low standby-current level shifter which generates the GND (e.g., 0V) to VSSH (e.g., −7V) output signals with high output current and low power dissipation. The circuit implements a negative shift-level converter. To reduce the standby static currents in the circuit, a high-voltage buffer stage is added between the HV NMOS transistor of the output stage and the static level shifter. One of the HV buffer stages is formed by HV source-follower transistor M16, pull-down transistor M15, and the current source I1. The cross-coupled pair is split up into two parts (M3, M4, M11, M12 and M5, M6, M13, M14) in order to obtain a the voltage swing from VSSH to VSSH+VDD for FL1 and FL1_INV. The splitting of the cross-coupled pair in the static level-shifter cell maintains the voltage swing at VDD for SH since the voltage level of SH is VSSH+VDD and the voltage level of SH2 must be (VSSH+VDD+|V_{tn}|).

The operation of the second stage 520 is as follows: when $\overline{SH1}$ is active and high, the output is pulled down to VSSH by discharging the gate capacitance of the output NMOS device. When SH2 is active and high, SH is pulled up until M16 enters into weak inversion, thus charging the gate capacitance to VOUT. While the maximum voltage swing of SH is limited to VDD by the static level-shifter cell, its voltage level is maintained at (VSSH+VDD) by the current source I1. The static value of I1 should be close to the minimum current required to keep M16 in weak inversion.

The "Beta Multiplier Current Mirror" 525 is used to generate the reference current. The size of NMOS transistors M3, M6, M11 and M14 is preferably carefully chosen so that the voltage swing of the output signal SH is VDD, according to the following:

$$VOUT = VSSH + \left[\sqrt{\frac{2nI_{ref}}{K_n}}\left(\frac{1}{\sqrt{S_6}} + \frac{1}{\sqrt{S_{14}}}\right) + |V_{tn6}| + |V_{tn14}| - |V_{tn16}|\right]$$

The signals SH and $\overline{SH}$ are outputted to high-voltage buffers to generate the signals with voltage swing from VSSH to GND and with increased output current.

Figure 11:
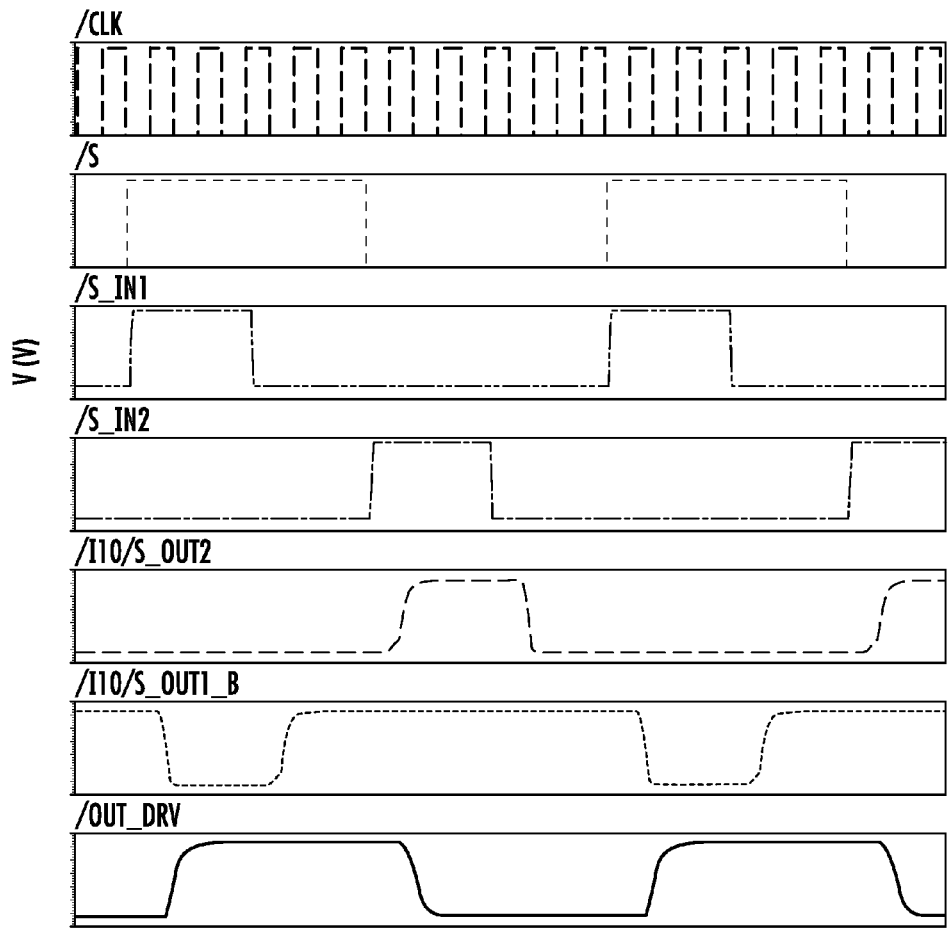
FIG. 11 depicts simulation waveforms for a driver circuit according to an exemplary embodiment of the present disclosure.

FIG. 11 provides Cadence-Spectre simulated waveforms for the driver circuit 400 using the exemplary two-stage level shifter circuit 500 as level shifter circuits 450 and 460. The input signal S is a 3.3V LV control signal, and the pulse generator changes this signal to two small pulse-width signals S_IN1 and S_IN2 with the same voltage levels. These two signals are outputted to the two-stage level shifters and transformed into two HV signals S_OUT2 and S_OUT1_B, which have the voltage-swing from −7V to 0V. Finally, these two HV signals are used to drive the PMOS and NMOS transistors of a resonant drive circuit and OUT_DRV is the signal at the gate of the GaN HFET device. The simulation forecasts reveal that the output drive current is about 50 mA. The rise time is about 5 ns, fall time is about 5 ns, and delay time is about 10 ns.

Figure 12:
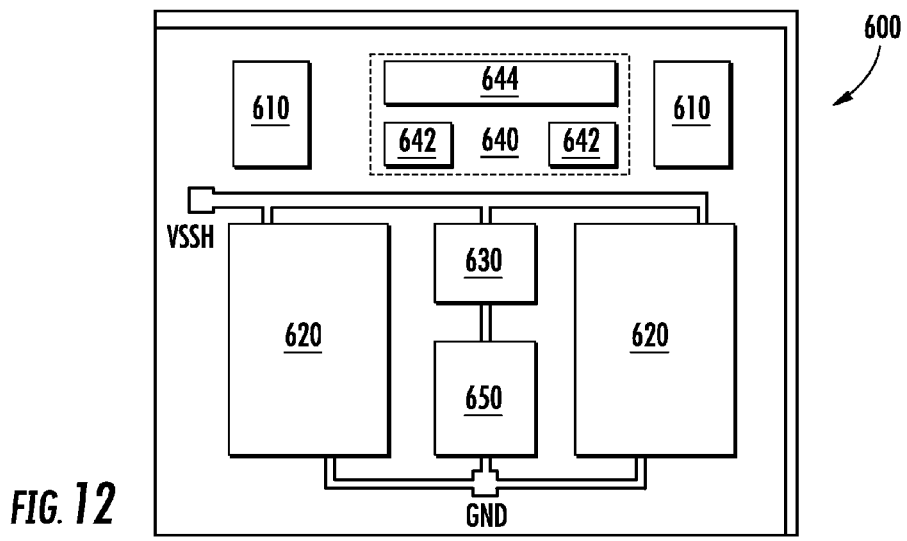
FIG. 12 depicts an exemplary integrated circuit layout for a driver circuit according to an exemplary embodiment of the present disclosure.

FIG. 12 depicts an exemplary layout 600 for an integrated circuit implementation of a driver circuit according to an exemplary embodiment of the present disclosure. As illustrated, the layout 600 includes locations for digital block 640 (which may include a pulse generator 644 and two buffer circuits 642), first stage circuitry 610 for two level shifter circuits, second stage circuitry 620 for two level shifter circuits, bias circuits 630 for two level shifter circuits, and the totem pole arrangement 650 of PMOS and NMOS transistors for a resonant drive circuit.

Since a driver circuit according to embodiments of the present disclosure can includes two identical level shifters, the use of mirror-image placements for the cells 610 and 620 provides advantages. First, it will save layout efforts, since the same layout can be used for both level shifters. Second, it will ensure that the two level shifters will have good matching between each other and, consequently, similar electrical characteristics.

The large amount of output current, i.e. 50 mA, required to drive the GaN HFET devices at 10 MHz, forces the use of layout techniques peculiar to high-current circuits. In particular the routing of the high-current leads represents an important aspect for the reliability of the circuit. Normally, electromigration sets a lower limit on the width of a high-current lead, but metal resistance often forces the use of much wider leads. All high-current leads are preferably kept as short as possible to reduce unnecessary metal resistance. The exemplary layout of the high-current power leads VSSH and GND of FIG. 12 make sure that these two leads can access all the related cells easily and with short lengths.

The pulse generator 644 and two buffers 642 are included in the digital block 640. The digital block 640 is powered by the LV power supply, VDD. In order to obtain good isolation between the digital and the analog part of the circuit, floating LV-devices instead of substrate based LV-devices can be used for the LV digital circuit. This can provide several advantages because floating devices are more robust against substrate noise; substrate based LV-devices can generate substrate noise; substrate based LV-devices can collect substrate currents; the area penalty for floating logic is negligible; and substrate based LV-devices need additional layers (Standard NTUB and PTUB) for isolation.

Figure 13:
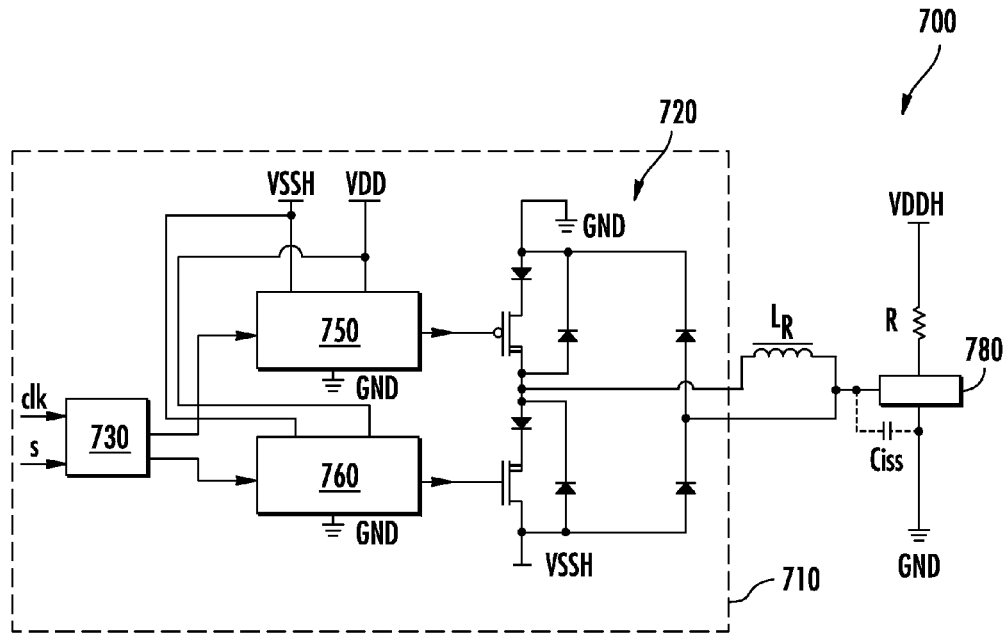
FIG. 13 depicts a driver circuit according to an exemplary embodiment of the present disclosure.

Referring now to FIG. 13, a block diagram of an integrated circuit implementation of a driver circuit 700 according to another exemplary embodiment of the present disclosure will be discussed in detail. Driver circuit 700 includes resonant drive circuit 720, digital block 730, and level shifter circuits 750 and 760. The totem pole arrangement and clamping diodes of resonant drive circuit 720, along with digital block 730, and level shifter circuits 750 and 760, are implemented on an integrated circuit 710 using SVX technology.

The digital block 730 converts the low voltage digital signal VDD into two narrow pulse-width control signals. The level shifters 750 and 760 change the polarity and amplify the voltage and power level of the control signals. The amplified signals are used to drive the GaN HFET device 780 by way of resonant drive circuit 720, the detail and operation of which is discussed above. Proper values of inductance $L_R$, obtained by adjusting the length of the PCB wire and of $C_{iss}$, the gate-source capacitance of the GaN HFET device, govern the resonant transition.

The level shifter circuits 750 and 760 are used to convert a positive signal with a GND to VDD voltage swing to a negative signal with a voltage swing from GND to VSSH. In a particular embodiment, level shifter circuits 750 and 760 can be two-stage level shifter circuits configured to change the polarity and amplify the control signals provided by digital block 730.

Figure 14:
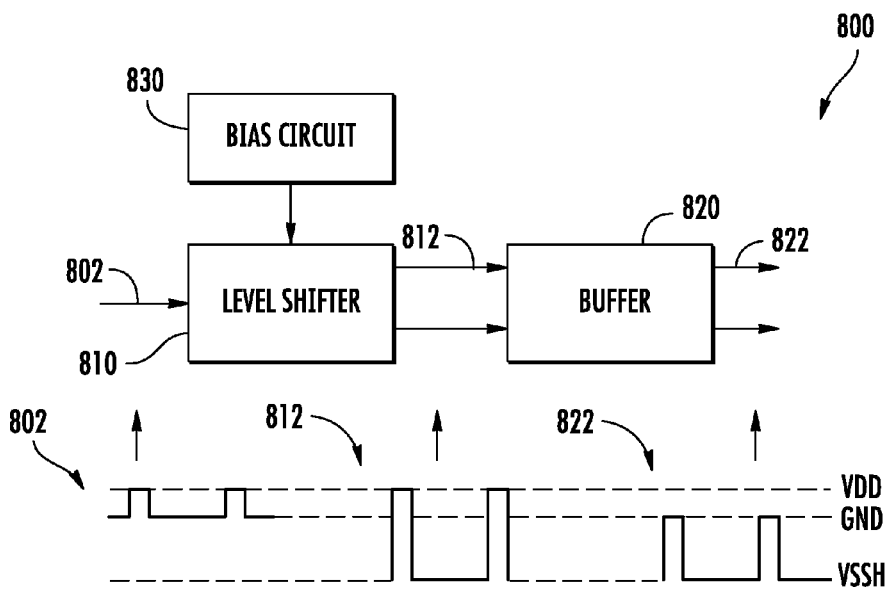
FIG. 14 depicts a block diagram of a two-stage level shifter circuit used in a driver circuit according to an exemplary embodiment of the present disclosure.

FIG. 14 provides a block diagram of an exemplary two-stage level shifter circuit 800. As illustrated, the two-stage level shifter circuit 800 includes three main parts, a first stage 810, a second stage 820, and a bias circuit 830. The first stage 810 is a level shifter stage configured to receive signal 802 which alternates between GND and VDD and convert signal 802 into signal 812. Signal 812 alternates between VDD and VSSH. Second stage is a buffer stage 820 configured to receive signal 812 and convert signal 812 to signal 822. Signal 822 alternates between GND and VSSH. The bias circuit 830 provides all the bias voltages and currents for the level shifter stage 810.

Figure 15:
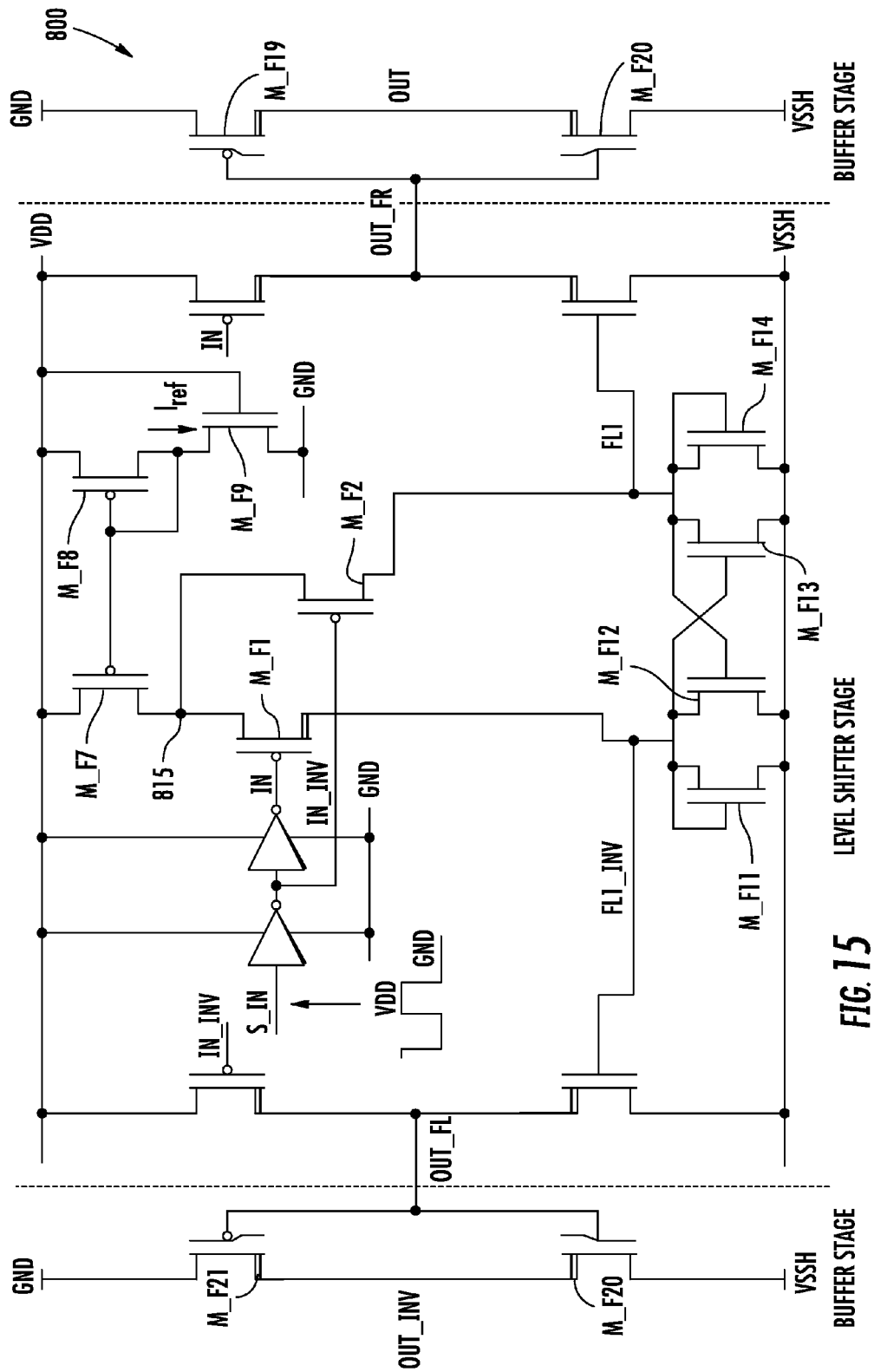
FIG. 15 depicts a circuit diagram of a level shifter circuit used in a driver circuit according to an exemplary embodiment of the present disclosure.

A circuit diagram of one exemplary two-stage level shifter circuit 800 is illustrated in FIG. 15. A current mirror topology is used to bias the first stage (level shifter cell). The reference current Iref is generated by means of three transistors: M_F7, M_F8 and M_F9. The size of M_F9 is adjusted to obtain required reference current Iref calculated approximately by the following:

$$I_{ref} = \frac{\beta_n(\text{M\_F9})}{2n}(V_{GS}(\text{M\_F9}) - V_{tn})^2$$
$$= \frac{\beta_n(\text{M\_F9})}{2n}(VDD - V_{tn})^2$$

If the transistors M_F7 and M_F8 are matched, a current equal to Iref will switch between M_F11 and M_F14 by turning on and off of the input transistors M_F1 and M_F2.

The first stage or level shifter stage comprises two coupled voltage mirrors. One voltage mirror includes an HV PMOS M_F2, together with a low-voltage NMOS M_F14 connected in a diode configuration as the load. In parallel to M_F14, a pull-down transistor M_F13 is necessary to drive the output voltage to a high-voltage power supply VSSH in the low state. The other voltage mirror includes a HV PMOS M_F1 with a low-voltage NMOS M_F11 connected as the load. M_F12 is connected in parallel to M_F11. The driving signal of the gate of M_F13 must be complementary to FL1 due to cross-coupling of the two voltage mirrors.

Assuming the output voltage is always low enough to bias M_F2 in the saturation region, the NMOS transistor M_F14, connected as a diode, always works in the saturated region. Choosing the same size for transistors M_F7 and M_F8, the current flowing through transistor M_F14, calculated by the following equation, will be equal to Iref.

$$I_{M\_F14} = \frac{\beta_n(\text{M\_F14})}{2n}(V_{GS}(\text{M\_F14}) - V_{tn})^2$$
$$= \frac{\beta_n(\text{M\_F14})}{2n}(V(FL1) - VSSH - V_{tn})^2$$

Since $I_{M\_F14}$=Iref, solving the above equation, the output voltage for signal FL, is provided as follows:

$$V(FL1) = VSSH + \sqrt{\frac{2nI_{ref}}{\beta_n(\text{M\_F14})}} + V_{tn}$$

Solving the above equations, the following equation is obtained:

$$V(FL1) = VSSH + \sqrt{\frac{2nI_{ref}}{\beta_n}} + V_{tn}$$
$$= VSSH + \sqrt{\frac{2n\frac{\beta_n(\text{M\_F9})}{2n}(VDD - V_{tn})^2}{\beta_n(\text{M\_F14})}} + V_{tn}$$

Using three identical NMOS transistors for M_F11, M_F14, and M_F9, the output voltage level of FL1 and FL1_INV can be fixed by the current flowing through M_F11 and M_F14. The possible deviation of the output voltage is given by the tolerance of the low-voltage power supply, according to the following:

$$V(FL1) = VSSH + \sqrt{\frac{2n\frac{\beta_n(\text{M\_F9})}{2n}(VDD - V_{tn})^2}{\beta_n(\text{M\_F14})}} + V_{tn}$$
$$= VSSH + \sqrt{\frac{2n\frac{\beta_n}{2n}(VDD - V_{tn})^2}{\beta_n}} + V_{tn}$$
$$= VSSH + VDD$$

The voltage swing of the output signals can be affected by other factors such as matching of transistors M_F11, M_F14 and M_F9, matching between transistors M_F7 and M_F8, etc. However, this kind of deviation can be reduced by a good layout design.

The low level of the input digital signals (3.3V) and the voltage drop at the current mirror node 815, as shown in FIG. 15, increase the importance of the choice of the input transistor in the stage. To provide the correct operation of the circuit and to reduce the transistor size for fast switching, low threshold-voltage HV transistors are preferably chosen for the input stage of the first stage low-current level shifter. As shown in FIG. 15, most transistors in the circuit are low-voltage (LV) transistors. Also, the current of the circuit is low and only two small size HV transistors are required for the input transistors. All these characteristics make the circuit suitable for high frequency operation.

A HV buffer stage, which works under the voltage VSSH and GND, is added after the first-stage level-shifter cell to change the voltage level and the drive capability of the control signals. The buffer stage is composed of a pair of thick gate-oxide PMOS transistors M_F19 and M_F21 and a pair of thick gate-oxide NMOS transistors M_F20 and M_F22. For obtaining a specific value of output current, higher gate-source voltage means smaller transistor sizes, so higher operation speed. The sizes of the transistors and the stages of the buffer can be adjusted according to the required drive current and speed. Consequently, this buffer stage with high gate-source voltage increases the drive capability of the signals and maintains a high operation frequency at the same time.

Figure 16:
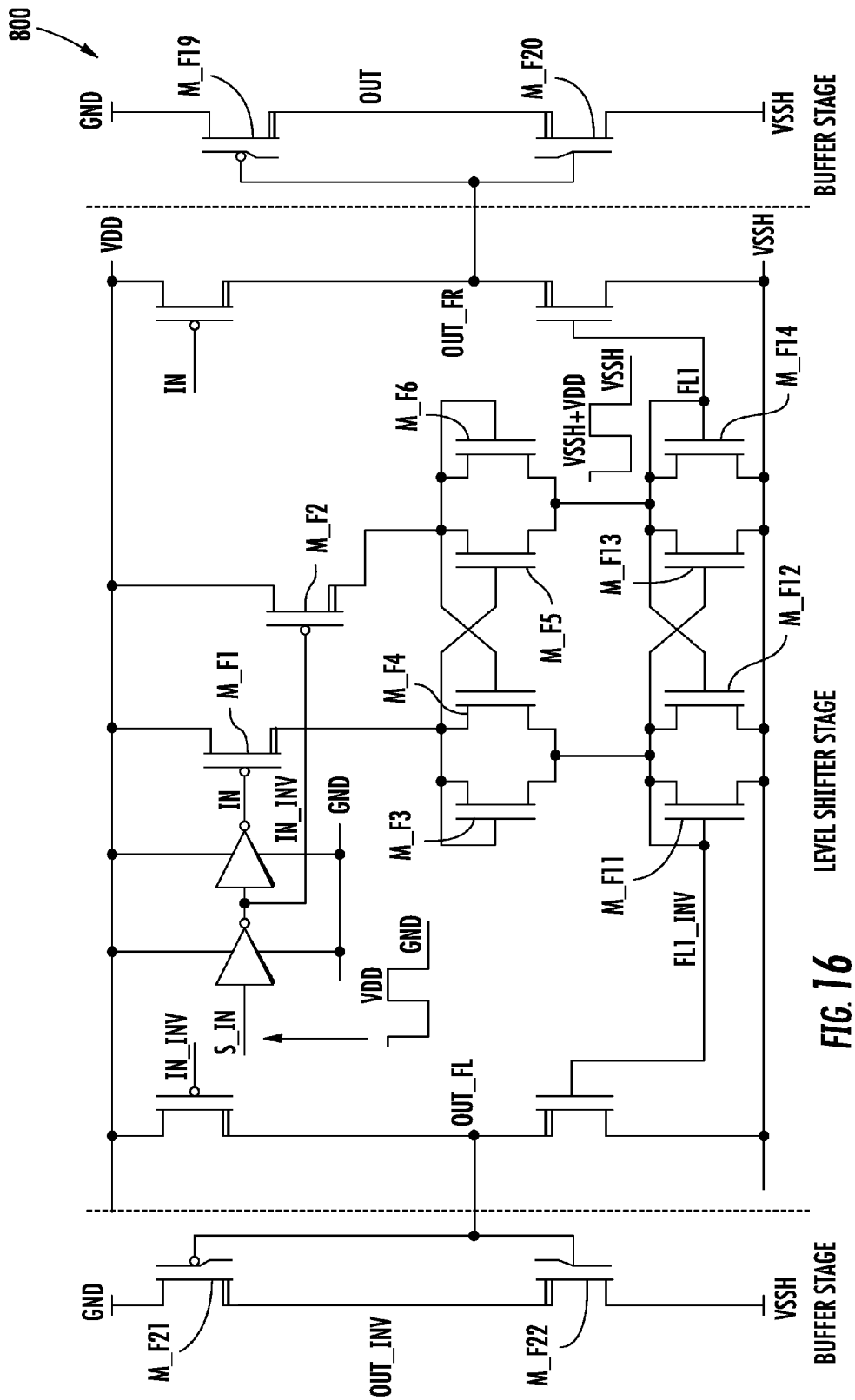
FIG. 16 depicts a circuit diagram of a level shifter circuit used in a driver circuit according to an exemplary embodiment of the present disclosure.

FIG. 16 illustrates a variation of the level shifter circuit 800 depicted in FIG. 15. As described with respect to FIG. 15, the low input voltage levels and the voltage drop at the node 815 of FIG. 15 make the selection of the input transistors M_F1 and M_F2 critical and also affect the safe operation of the circuit since the threshold voltages of the high-voltage input transistors are usually high. FIG. 16 provides a level shifter circuit 800 that overcomes this disadvantage.

As shown in FIG. 16, the current mirror is removed in this level shifter. The sources of the input transistors are directly connected to the positive power supply VDD to eliminate the turn-on failure risk due to the voltage drop at node 815 of FIG. 15 and the large threshold voltages of the input transistors. The cross-coupled pair (M_F11, M_F12 and M_F13, M_14 of FIG. 15) is split up into two parts (M_F3, M_F4, M_F11, M_F12 and M_F5, M_F6, M_F13, M_F14 of FIG. 16) in order to obtain a the voltage swing from VSSH to VSSH+VDD for FL1 and FL1_INV and to maintain a voltage drop as low as possible across the splitting voltage mirror pair so that the input transistors always work at the saturation region and low-voltage transistors can be used in the voltage mirror to obtain high operation speed. However, the sizes for all the transistors in the exemplary embodiment of FIG. 16 need to be carefully selected to obtain required output voltage and current.

Figure 17:
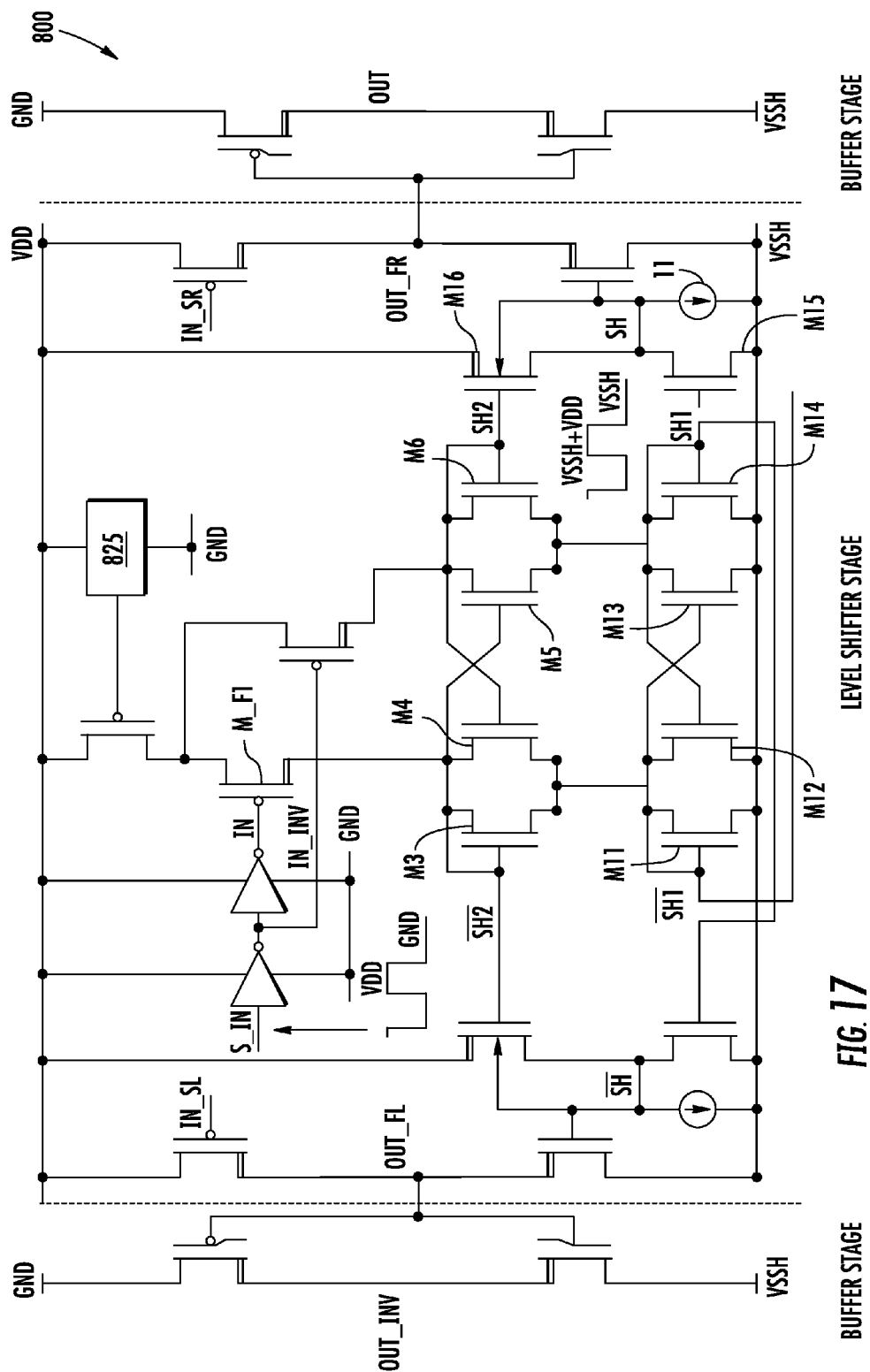
FIG. 17 depicts a circuit diagram of a level shifter circuit used in a driver circuit according to an exemplary embodiment of the present disclosure.

FIG. 17 depicts another embodiment of a two-stage level shifter circuit 800. The two-stage level shifter circuit 800 of FIG. 17 implements a low standby-current positive-to-negative level shifter cell. A high-voltage buffer stage is added between the HV NMOS transistor of the output stage and the static level shifter in order to reduce the standby static-currents in the circuit. One of the HV buffer stages is formed by HV source-follower transistor M16, pull-down transistor M15, and the current source I1. The cross-coupled pair is split up into two parts (M3, M4, M11, M12 and M5, M6, M13, M14). The splitting of the cross-coupled pair in the static level-shifter cell maintains the voltage swing at VDD for SH since the voltage level of SH is VSSH+VDD and the voltage level of SH2 must be (VSSH+VDD+|Vml|).

The operation of level shifter circuit 800 of FIG. 17 is as follows: when $\overline{SH1}$ is active and high, the output is pulled down to VSSH by discharging the gate capacitance of the output NMOS device. When SH2 is active and high, SH is pulled up until M16 enters into weak inversion, thus charging the gate capacitance to VOUT. While the maximum voltage swing of SH is limited to VDD by the static level-shifter cell, its voltage level is maintained at (VSSH+VDD) by the current source I1. The static value of I1 should be close to the minimum current required to keep M16 in weak inversion.

The "Beta Multiplier Current Mirror" 825 is used to generate the reference current. The size of NMOS transistors M3, M6, M11 and M14 needs to be carefully chosen so that the voltage swing of the output signal SH is VDD, according to the following:

$$VOUT = VSSH + \left[\sqrt{\frac{2nI_{ref}}{K_n}}\left(\frac{1}{\sqrt{S_6}} + \frac{1}{\sqrt{S_{14}}}\right) + |V_{tm6}| + |V_{tm14}| - |V_{tm16}|\right]$$

The signals SH and $\overline{SH}$ are outputted to high-voltage buffers to generate the signals with voltage swing from VSSH to GND and with increased output current.

For this stage the same bias circuit used in FIG. 15 is chosen for the low standby-current level shifter. The voltage swing of the output signal SH can be calculated according to the following:

$$V(SH) = VSSH + \left[\sqrt{\frac{2nI_{ref}}{K_n}}\left(\frac{1}{\sqrt{S_6}} + \frac{1}{\sqrt{S_{14}}}\right) + |V_{tm6}| + |V_{tm14}| - |V_{tm16}|\right]$$

Solving the above equation leads to the following equation:

$$\begin{aligned} V(SH) &= VSSH + \left[\sqrt{\frac{2n\frac{K_n S_9}{2n}(VDD - V_{tn9})^2}{K_n}}\left(\frac{1}{\sqrt{S_6}} + \frac{1}{\sqrt{S_{14}}}\right) + \right.\\ &\quad\left. |V_{tm6}| + |V_{tm14}| - |V_{tm16}|\right]\\ &= VSSH + \left[(VDD - V_{tn9}) * \sqrt{S_9} * \left(\frac{1}{\sqrt{S_6}} + \frac{1}{\sqrt{S_{14}}}\right) + \right.\\ &\quad\left. |V_{tm6}| + |V_{tm14}| - |V_{tm16}|\right] \end{aligned}$$

Three identical type and size of NMOS transistors are chosen for M6, M14, and M16, and same type and ¼ size of NMOS transistor is used for M_F9 of FIG. 15. Using these parameters, a voltage swing of VDD can be obtained by the low standby-current level shifter, as shown below:

$$\begin{aligned} V(SH) &= VSSH + \left[(VDD - V_{tn}) * \sqrt{S/4} * \left(\frac{1}{\sqrt{S}} + \frac{1}{\sqrt{S}}\right) + |V_{tn}| + |V_{tn}| - |V_{tn}|\right]\\ &= VSSH + VDD \end{aligned}$$

The same high-voltage buffer stage described with respect to FIG. 15 is used to convert SH to a high-voltage signal VOUT which has a voltage swing from VSSH to VDD.

Figure 18:
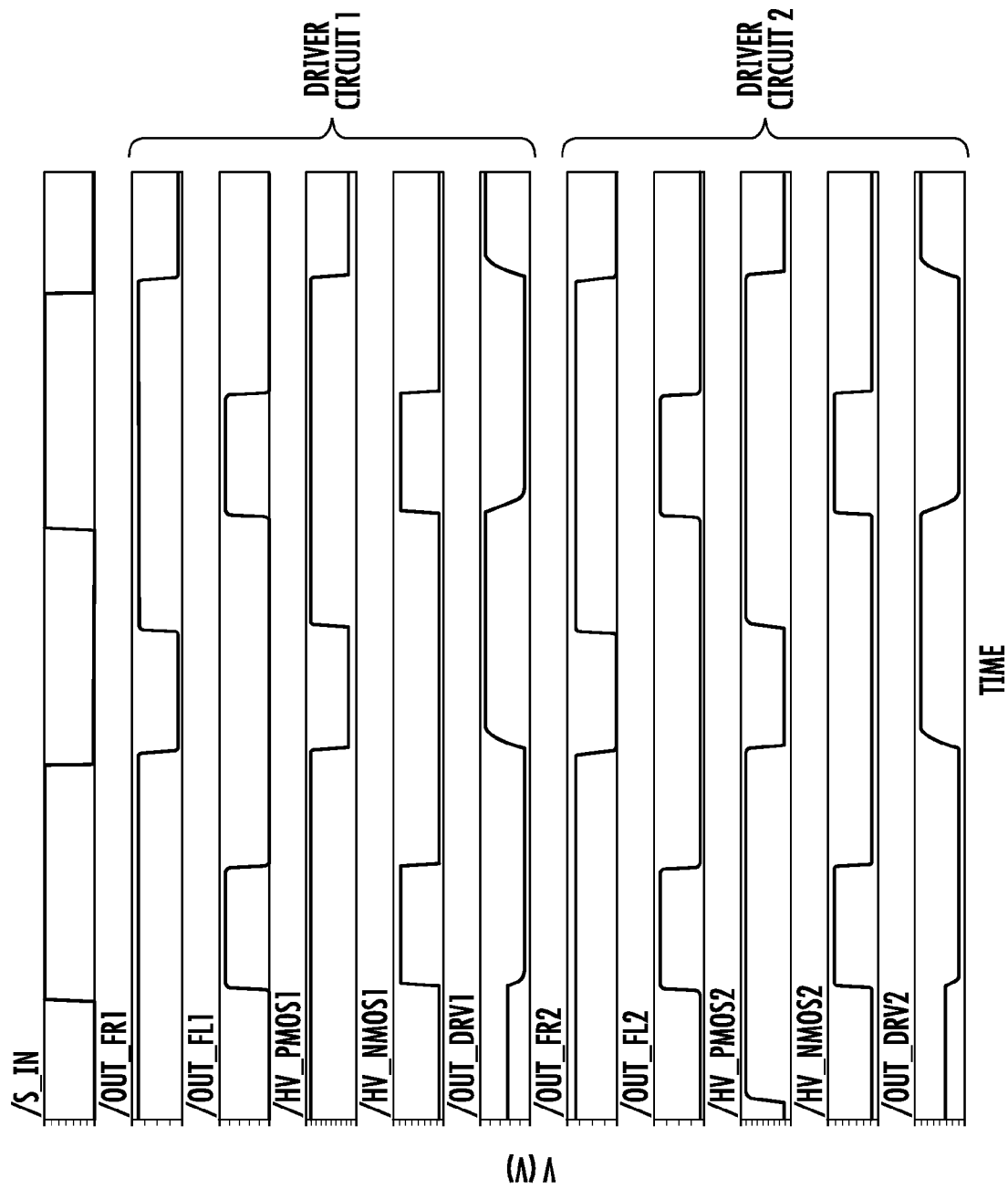
FIG. 18 depicts simulation waveforms for a driver circuit according to an exemplary embodiment of the present disclosure.
Figure 19:
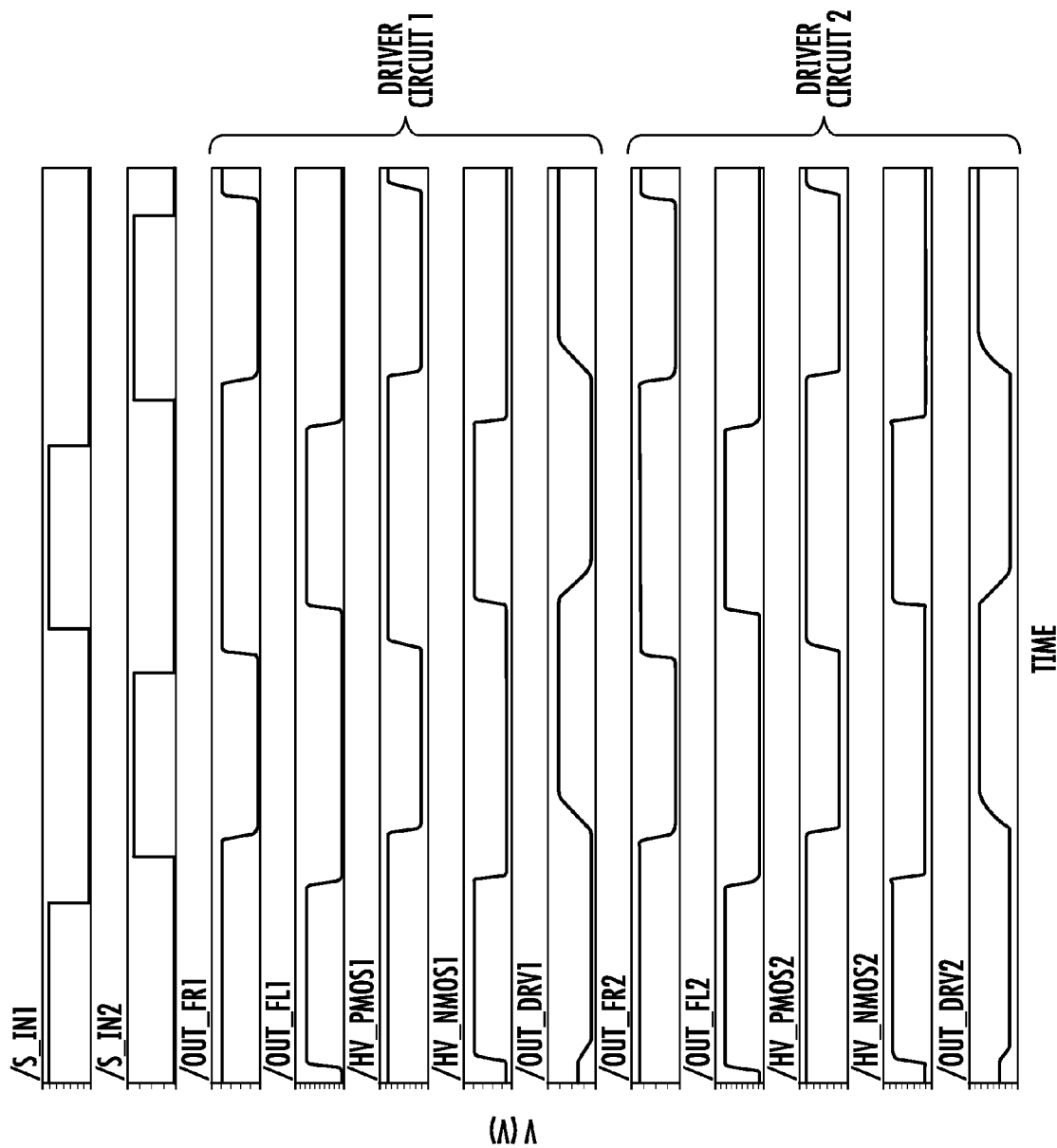
FIG. 19 depicts simulation waveforms for a driver circuit according to an exemplary embodiment of the present disclosure.

FIGS. 18 and 19 provides a full set of Cadence-Spectre simulations for relevant waveforms of two exemplary driver circuits according to embodiments of the present disclosure. The waveforms labeled Driver Circuit 1 are associated with a driver circuit with the level shifter circuit depicted in FIG. 15. The waveforms associated with Driver Circuit 2 are associated with a driver circuit using the level shifter circuit depicted in FIG. 16.

In FIG. 18, the input signal S_IN is an external 3.3V LV control signal, and the pulse generator changes this signal to two small pulse-width signals with the same voltage levels. In FIG. 19, two external small pulse-width signals, S_IN1 and S_IN2, are selected directly as the inputs by the digital block. These small pulse-width signals are output to the two-stage level shifters and transformed into two HV signals HV_PMOS and HV_NMOS, which have the voltage-swing from −7V to 0V. Finally, these two HV signals are used to drive the HV PMOS and HV NMOS transistors of the resonant drive circuit and OUT_DRV1/OUT_DRV2 are the output drive signals from the drive circuit, which are used to drive the GaN HFET devices. The loads for both of the drive circuits are capacitors which have a comparable value with the input capacitance of the GaN HFET devices targeted to drive. Both of the drive circuits provide a 50 mA output drive current. FIG. 18 shows the simulation waveforms for Driver Circuit 1 and Driver Circuit 2 when they have one input control signal and have the operation frequency at 10 MHz. FIG. 19 shows the simulation waveforms for Driver Circuit 1 and Driver Circuit 2 when they choose two external control signals as their inputs and work at 20 MHz.

As shown in FIGS. 18 and 19, the simulation forecasts reveal that both, Driver Circuit 1 and Driver Circuit 2, work well at 10 MHz and higher and have similar rise time, fall time and delay time. The rise time is about 3 ns, fall time is nearly 3 ns, and delay time is around 5 ns.

Figure 20:
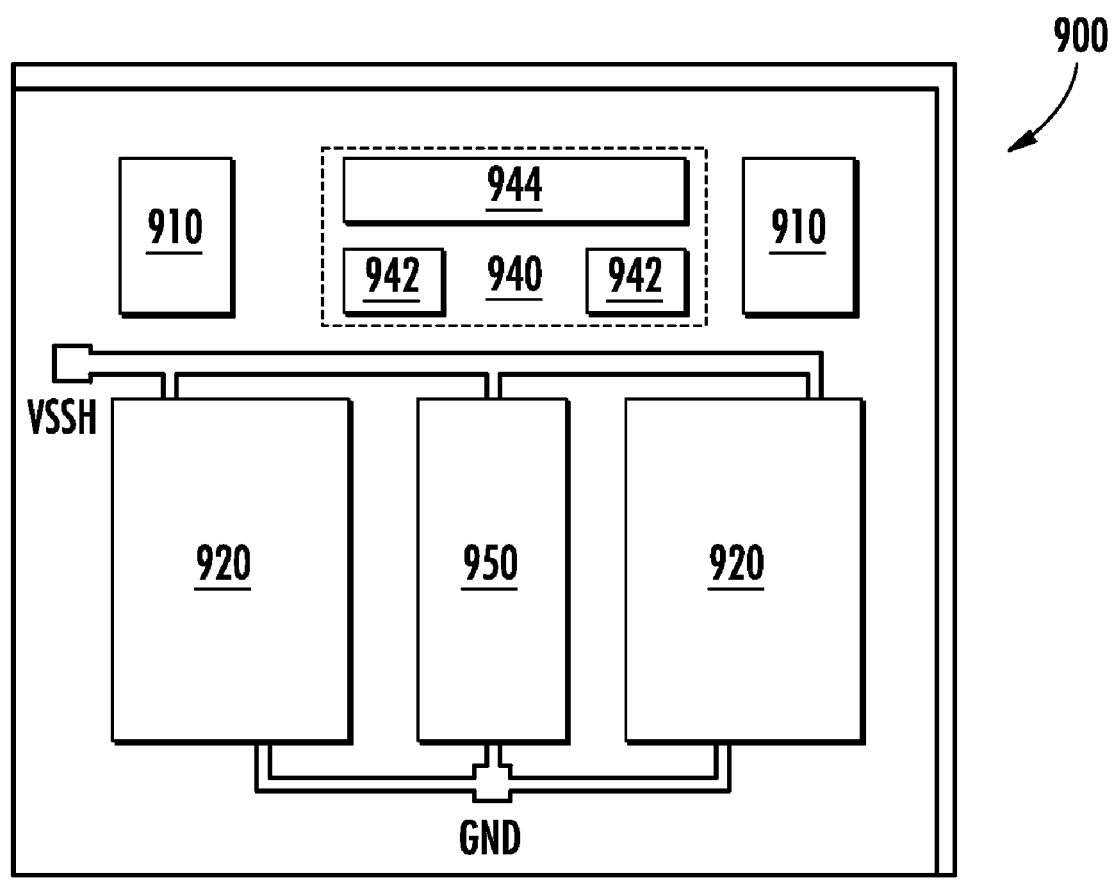
FIG. 20 depicts an exemplary integrated circuit layout for a driver circuit according to an exemplary embodiment of the present disclosure.

FIG. 20 depicts an exemplary layout for an integrated circuit implementation of a driver circuit according to an exemplary embodiment of the present disclosure. As illustrated, the layout 900 includes locations for digital block 940 (which may include a pulse generator 944 and two buffer circuits 942), first stage (level shifter) and bias cells 910 for two level shifter circuits, second stage (buffer) cells 920 for two level shifter circuits, and the totem pole arrangement 950 of PMOS and NMOS transistors for resonant drive circuit.

Since a driver circuit according to embodiments of the present disclosure can include two identical level shifters, the use of mirror-image placements for the cells 910 and 920 provides advantages. First, it will save layout efforts, since the same layout can be used for both level shifters. Second, it will ensure that the two level shifters will have good matching between each other and, consequently, similar electrical characteristics.

The large amount of output current, i.e. 50 mA, required to drive the GaN HFET devices at 10 MHz, forces the use of layout techniques peculiar to high-current circuits. In particular the routing of the high-current leads represents an important aspect for the reliability of the circuit. Normally, electromigration sets a lower limit on the width of a high-current lead, but metal resistance often forces the use of much wider leads. All high-current leads are preferably kept as short as possible to minimize unnecessary metal resistance. The exemplary layout of the high-current power leads VSSH and GND of FIG. 12 make sure that these two leads can access all the related cells easily and with short lengths.

The pulse generator 944 and two buffers 942 are included in the digital block 940. The digital block 940 is powered by the LV power supply, VDD. In order to obtain good isolation between the digital and the analog part of the circuit, floating LV-devices instead of substrate based LV-devices can be used for the LV digital circuit. This can provide several advantages because floating devices are more robust against substrate noise; substrate based LV-devices can generate substrate noise; substrate based LV-devices can collect substrate currents; the area penalty for floating logic is negligible; and substrate based LV-devices need additional layers (Standard NTUB and PTUB) for isolation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A driver circuit for driving a III-Nitride HFET device, comprising:
    a resonant drive circuit coupled to the III-Nitride HFET device, said resonant drive circuit comprising an LC circuit having an inductance and a capacitance, the capacitance of said LC circuit comprising the gate-source capacitance of the III-Nitride HFET device;
    a level shifter circuit configured to receive a first signal and to amplify the first signal to a second signal, the polarity of the second signal being different from the first signal;
    wherein said resonant drive circuit is controlled based at least in part on the second signal such that said resonant drive circuit provides a first voltage to the III-Nitride HFET device to control the III-Nitride HFET device to operate in a conducting state and to provide a second voltage to the III-Nitride HFET device to control the III-Nitride HFET device to operate in a non-conducting state;
    wherein said level shifter circuit comprises a first stage and a second stage, said first stage configured to receive the first signal and to convert the first signal to a third signal, the third signal alternating between a peak voltage of the first signal and the second voltage, said second stage configured to receive the third signal and to convert the third signal to the second signal, the second signal alternating between the first voltage and the second voltage.

2. The driver circuit of claim 1, wherein the first voltage is about 0V and the second voltage is about −7V.

3. The driver circuit of claim 1, wherein the first signal alternates between a voltage of about 0V and about 3.3V and the second signal alternates between a voltage of about 0V and about −7V.

4. The driver circuit of claim 1, wherein said resonant drive circuit comprises a totem pole arrangement of a PMOS transistor and a NMOS transistor, said LC circuit being coupled to a junction between the PMOS transistor and the NMOS transistor, said resonant driver circuit further comprising first and second clamping diodes, said first clamping diode coupled to said LC circuit and to said PMOS transistor, said second clamping diode coupled to said LC circuit and to said NMOS transistor.

5. The driver circuit of claim 1, wherein said inductance of said LC circuit comprises a parasitic inductance of a conductor.

6. The driver circuit of claim 1, wherein said second stage comprises a low standby current level shifter circuit.

7. The driver circuit of claim 1, wherein said second stage comprises a buffer circuit.

8. The driver circuit of claim 1, wherein said driver circuit is implemented as an integrated circuit.

9. An integrated circuit for driving a GaN HFET device, comprising:
- a resonant drive circuit coupled to the GaN HFET device, said resonant drive circuit comprising a totem pole arrangement of a PMOS transistor and a NMOS transistor, an LC circuit being coupled to a junction between said PMOS transistor and said NMOS transistor, said LC circuit having an inductance and a capacitance, the capacitance of said LC circuit comprising the gate-source capacitance of the GaN HFET device;
- a first level shifter circuit coupled to the gate of said PMOS transistor, said first level shifter circuit configured to receive a first signal and to amplify the first signal to a second signal, the polarity of the second signal being different from the first signal, the second signal alternating between a first voltage and a second voltage, the second signal controlling said PMOS transistor to operate in a conducting state when the second signal is at the first voltage and the second signal controlling said PMOS transistor to operate in a non-conducting state when the second signal is at the second voltage;
- a second level shifter circuit coupled to the gate of said NMOS transistor configured to receive a third signal and to amplify the third signal to a fourth signal, the polarity of the fourth signal being different from the third signal, the fourth signal alternating between the first voltage and the second voltage, the fourth signal controlling said NMOS transistor to operate in a conducting state when the fourth signal is at the second voltage and the fourth signal controlling said NMOS transistor to operate in a non-conducting state when the fourth signal is at the first voltage;
- wherein when said PMOS transistor is in a conducting state and said NMOS transistor is in a non-conducting state, said resonant drive circuit provides the first voltage to the GaN HFET device to control the GaN HFET device to operate in a conducting state, and when said PMOS transistor is a non-conducting state and said NMOS transistor is in a conducting state, said resonant drive circuit provides a second voltage to the GaN HFET device to control the GaN HFET device to operate in a non-conducting state;
- wherein said first and second level shifter circuits each comprise a first stage and a second stage, wherein:
- said first stage of said first level shifter circuit is configured to receive the first signal and to convert the first signal to a fifth signal, the fifth signal alternating between a peak voltage of the first signal and the second voltage, said second stage of said first level circuit configured to receive the fifth signal and to convert the fifth signal to the second signal; and
- said second stage of said second level shifter circuit being configured to receive the third signal and to convert the third signal to a sixth signal, the sixth signal alternating between a peak voltage of the third signal and the second voltage, said second stage of said second level shifter circuit configured to receive the sixth signal and to convert the sixth signal to the fourth signal.

10. The integrated circuit of claim 9, wherein at least one of said second stage of said first level shifter circuit and said second stage of said second level shifter circuit comprises a low standby current level shifter circuit, said low standby current level shifter circuit comprising a static level-shifter cell, source-follower transistor, pull down transistor and current source.

11. The integrated circuit of claim 9, wherein at least one of said second stage of said first level shifter circuit and said second stage of said second level shifter circuit comprises a buffer circuit, said buffer circuit comprising a pair of second and third PMOS transistors and a pair of second and third NMOS transistors.

12. The integrated circuit of claim 9, wherein at least one of said first stage of said first level shifter circuit and said first stage of said second level shifter circuit comprises two coupled voltage mirror circuits.

13. The integrated circuit of claim 9, wherein at least one of said first stage of said first level shifter circuit and said first stage of said second level shifter circuit comprises two coupled voltage mirror circuits and a current mirror circuit.

14. The integrated circuit of claim 9, wherein at least one of said first stage of said first level shifter circuit and said first stage of said second level shifter circuit comprises a low standby current level shifter circuit, said low standby current level shifter circuit comprising a static level-shifter cell, source-follower transistor, pull down transistor and current source.

15. The integrated circuit of claim 9, wherein said first level shifter circuit and said second level shifter circuit further comprise a bias circuit configured to provide a bias current and a bias voltage.

16. The integrated circuit of claim 9, wherein said integrated circuit is implemented using Smart-Voltage-eXtension (SVX) technology.

* * * * *